US00RE50503E

(19) United States
(12) Reissued Patent
Kim et al.

(10) Patent Number: US RE50,503 E
(45) Date of Reissued Patent: *Jul. 22, 2025

(54) MASTER-SLAVE FLIP FLOP

(71) Applicant: SAMSUNG ELECTRONICS CO., LTD., Suwon-si (KR)

(72) Inventors: Min Su Kim, Hwaseong-si (KR); Dae Seong Lee, Busan (KR)

(73) Assignee: SAMSUNG ELECTRONICS CO., LTD., Suwon-si (KR)

( * ) Notice: This patent is subject to a terminal disclaimer.

(21) Appl. No.: 17/691,396

(22) Filed: Mar. 10, 2022

Related U.S. Patent Documents

Reissue of:
(64) Patent No.: 10,587,249
Issued: Mar. 10, 2020
Appl. No.: 16/411,562
Filed: May 14, 2019

U.S. Applications:
(63) Continuation of application No. 15/969,437, filed on May 2, 2018, now Pat. No. 10,291,212.

(30) Foreign Application Priority Data

Sep. 19, 2017 (KR) ..... 10-2017-0120662

(51) Int. Cl.
*H03K 3/356* (2006.01)
*H03K 3/3562* (2006.01)
*H03K 19/20* (2006.01)

(52) U.S. Cl.
CPC ..... *H03K 3/35625* (2013.01); *H03K 19/20* (2013.01)

(58) Field of Classification Search
CPC .. H03K 3/356; H03K 3/3562; H03K 3/35625; H03K 19/20
USPC ..... 327/202, 210, 211, 212, 303
See application file for complete search history.

(56) References Cited

U.S. PATENT DOCUMENTS

| | | | | |
|---|---|---|---|---|
| 6,818,929 | B2 | 11/2004 | Tsutsumi et al. | |
| 7,309,908 | B2 | 12/2007 | Nozoe et al. | |
| 8,264,049 | B2 | 9/2012 | Becker | |
| 8,274,319 | B2 | 9/2012 | Maeno | |
| 8,856,704 | B2 | 10/2014 | Baeg | |
| 9,035,392 | B2 | 5/2015 | Tsuda et al. | |
| 9,324,715 | B2 | 4/2016 | Azmat et al. | |
| 9,641,161 | B1 * | 5/2017 | Liu | H03K 3/35625 |
| 10,291,212 | B2 * | 5/2019 | Kim | H03K 3/35625 |

(Continued)

OTHER PUBLICATIONS

Notice of Allowance dated Jan. 3, 2019 in corresponding U.S. Appl. No. 15/959,437.

*Primary Examiner* — My Trang Ton
(74) *Attorney, Agent, or Firm* — MORGAN, LEWIS & BOCKIUS LLP

(57) ABSTRACT

A master-slave flip flop includes a master latch and a slave latch which are sequentially disposed on a substrate in a first direction. The master latch includes a first NMOS transistor and a first PMOS transistor each gated by a first clock signal. The first NMOS transistor and the first PMOS transistor share a first gate line extending in a second direction intersecting with the first direction. The slave latch includes a second NMOS transistor and a second PMOS transistor each gated by the first clock signal. The second NMOS transistor and the second NMOS transistor share a second gate line extending in the second direction. The first gate line and the second gate line are electrically connected to each other.

78 Claims, 17 Drawing Sheets

(56) References Cited

U.S. PATENT DOCUMENTS

| | | | | |
|---|---|---|---|---|
| 2016/0172360 | A1 | 6/2016 | Shimbo | |
| 2017/0077910 | A1* | 3/2017 | Kim | G01R 31/318541 |
| 2017/0308638 | A1* | 10/2017 | Gothi | G06F 17/5081 |
| 2018/0158811 | A1* | 6/2018 | Subhash | H01L 27/0207 |
| 2018/0168811 | A1 | 6/2018 | Subhash et al. | |
| 2018/0342462 | A1* | 11/2018 | Kuchanuri | H01L 23/485 |
| 2019/0089338 | A1 | 3/2019 | Kim et al. | |

* cited by examiner

FIG. 2 (Amended)
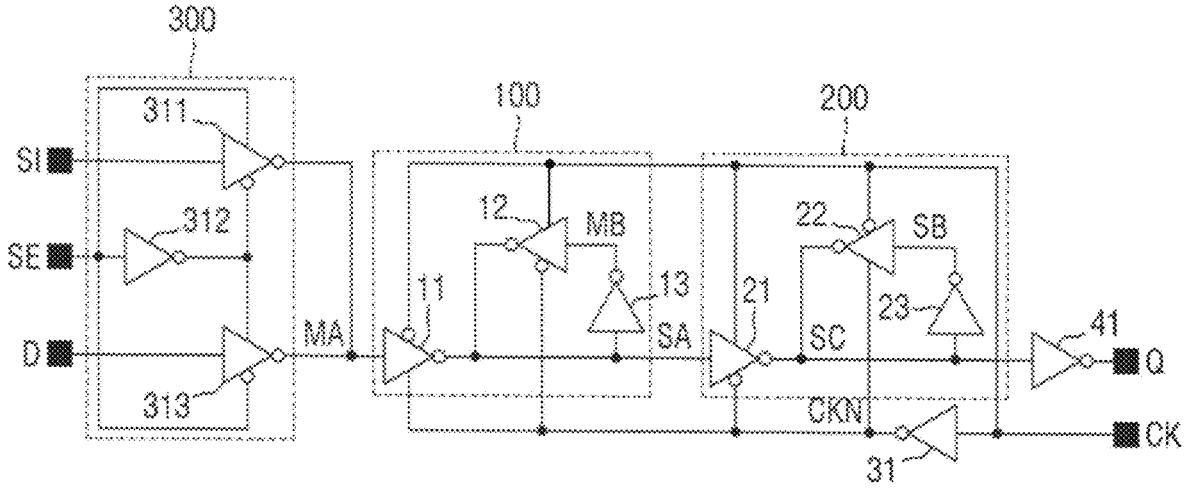

FIG. 6 (Amended)
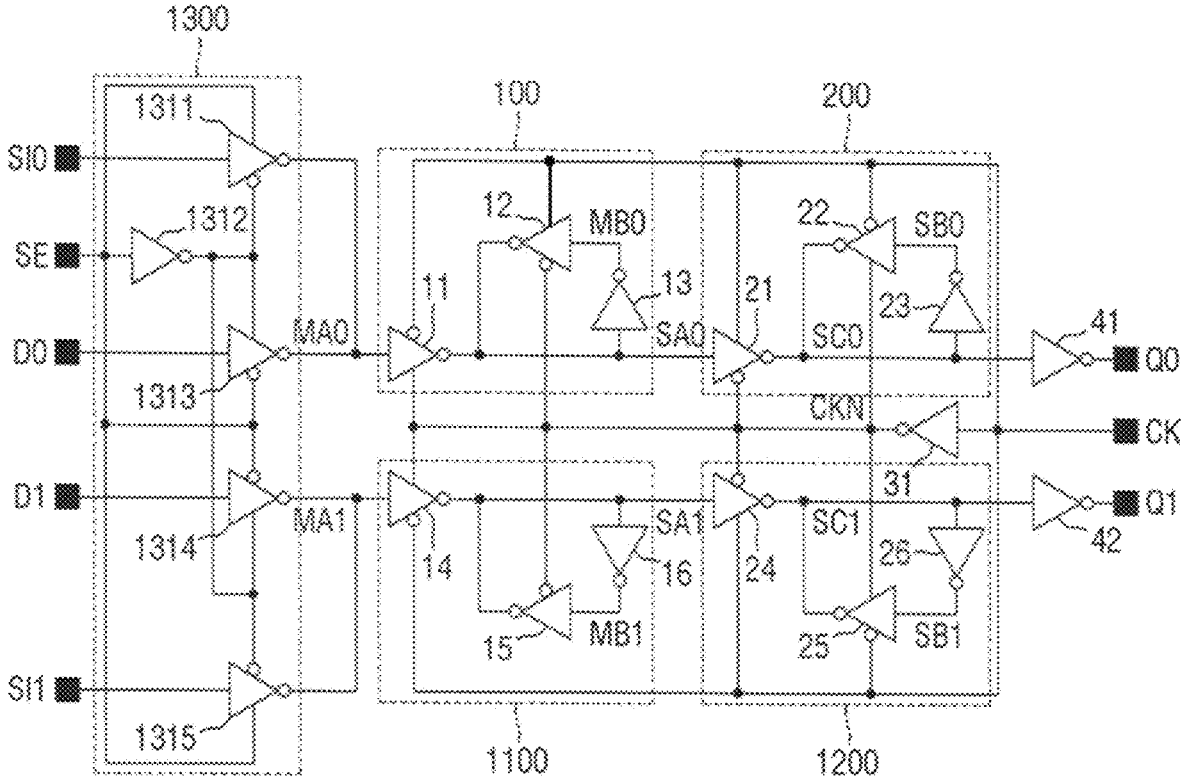

MASTER-SLAVE FLIP FLOP

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

[This application] *The present reissue application is a reissue application of U.S. Application No. 16/411,462, filed May 14, 2019, now U.S. Patent No. 10,587,249, which* is a continuation application of U.S. patent application Ser. No. 15/969,437 filed May 2, 2018, which claims priority under 35 U.S.C. 119 to Korean Patent Application No. 10-2017-0120662, filed on Sep. 19, 2017 in the Korean Intellectual Property Office, the disclosures of which are incorporated by reference herein in their entirety.

TECHNICAL FIELD

Exemplary embodiments of the inventive concept relate to a master-slave flip flop.

DISCUSSION OF RELATED ART

Semiconductor devices are increasingly downsized and multifunction in accordance with the demands of the electronics industry, and are reduced in weight to reduce manufacturing costs. Semiconductor devices may be classified into semiconductor memory devices for storing logic data, semiconductor logic devices for processing logical data, hybrid semiconductor devices including a memory element and a logic element, and the like.

A semiconductor memory device includes flip flop circuits and a latch. In designing a semiconductor chip, there is an increased demand for operating characteristics of a semiconductor memory device such as a flip flop, particularly, to achieve a balance between operating characteristics for low-power consumption operation and operating characteristics for high-speed operation.

SUMMARY

According to an exemplary embodiment of the inventive concept, a master-slave flip flop includes a master latch and a slave latch which are sequentially disposed on a substrate in a first direction. The master latch includes a first NMOS transistor and a first PMOS transistor each gated by a first clock signal, and the first NMOS transistor and the first PMOS transistor share a first gate line extending in a second direction intersecting with the first direction. The slave latch includes a second NMOS transistor and a second PMOS transistor each gated by the first clock signal, and the second NMOS transistor and the second PMOS transistor share a second gate line extending in the second direction. The first gate line and the second gate line are electrically connected to each other.

According to an exemplary embodiment of the inventive concept, a master-slave flip flop includes a first master slave circuit and a second master slave circuit which share a first clock signal and a second clock signal obtained by inverting the first clock signal and process different data signals. The first master slave circuit includes a first master latch and a first slave latch disposed on a substrate sequentially in a first direction. The second master slave circuit includes a second master latch and a second slave latch disposed on the substrate sequentially in the first direction. The first master latch includes a first NMOS transistor and a first PMOS transistor each gated by the first clock signal, and the first NMOS transistor and the first PMOS transistor share a first gate line extending in a second direction intersecting with the first direction. The second master latch includes a second PMOS transistor and a second NMOS transistor which share the first gate line and are each gated by the first clock signal. The first slave latch includes a third NMOS transistor and a third PMOS transistor each gated by the first clock signal, and the third NMOS transistor and the third PMOS transistor share a second gate line extending in the second direction. The second slave latch includes a fourth PMOS transistor and a fourth NMOS transistor which share the second gate line and are each gated by the first clock signal.

According to an exemplary embodiment of the inventive concept, a master-slave flip flop includes a master latch and a slave latch which are disposed side by side in a second direction intersecting with a first direction and share a first power rail and a second power rail, on a substrate including a first active region and a second active region each extending in the first direction and spaced apart from each other in the second direction. The master latch includes a first gate line extending in the second direction, a first transistor formed by overlap of the first gate line and the first active region, and a second transistor formed by overlap of the first gate line and the second active region, where a first clock signal is provided to the first gate line. The slave latch includes a second gate line extending in the second direction, a third transistor formed by overlap of the second gate line and the first active region, and a fourth transistor formed by overlap of the second gate line and the second active region, where the first clock signal is provided to the second gate line.

BRIEF DESCRIPTION OF THE DRAWINGS

The above and other aspects and features of the inventive concept will become more apparent by describing in detail exemplary embodiments thereof with reference to the attached drawings.

FIG. 2 is a circuit diagram of the master-slave flip flop of FIG. 1 according to an exemplary embodiment of the inventive concept.

FIG. 6 is a circuit diagram of a master-slave flip flop according to an exemplary embodiment of the inventive concept.

DETAILED DESCRIPTION OF THE EMBODIMENTS

Figure 1:
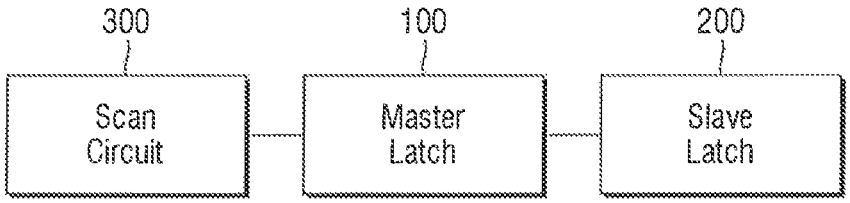
FIG. 1 is a block diagram of a master-slave flip flop according to an exemplary embodiment of the inventive concept.

Exemplary embodiments of the inventive concept provide a master-slave flip flop for low-power consumption and high-speed operations.

Exemplary embodiments of the inventive concept will be described more fully hereinafter with reference to the accompanying drawings. Like reference numerals may refer to like elements throughout this application.

Hereinafter, a master-slave flip flop according to exemplary embodiments of the inventive concept will be described with reference to FIGS. 1 through 10B.

FIG. 1 is a block diagram of a master-slave flip flop according to an exemplary embodiment of the inventive concept, and FIG. 2 is a circuit diagram of the master-slave flip flop of FIG. 1 according to an exemplary embodiment of the inventive concept.

Referring to FIGS. 1 and 2, the master-slave flip flop according to an exemplary embodiment of the inventive concept may include a master latch 100, a slave latch 200, and a scan circuit 300.

The scan circuit 300 may include an inverter 312, a first scan tri-state inverter 311, and a second scan tri-state inverter 313. The scan circuit 300 may receive a data signal D, a scan enable signal SE, and a scan input signal SI, and may output one of the data signal D and the scan input signal SI to a node MA in accordance with a control signal.

For example, the scan circuit 300 outputs the scan input signal SI to the node MA when the scan enable signal SE is a logic high (H). In other words, the first scan tri-state inverter 311 enabled by the scan enable signal SE at the logic high (H) may output the scan input signal SI to the node MA.

On the other hand, the scan circuit 300 may output the data signal D to the node MA when the scan enable signal SE is a logic low (L). For example, the second scan tri-state inverter 313 enabled by the scan enable signal SE at the logic low (L) may output the data signal D to the node MA.

The configuration of the scan circuit 300 illustrated in FIG. 2 is an example, and the inventive concept is not limited thereto. The scan circuit 300 may be provided by, for example, a plurality of transmission gates or multiplexers.

The master latch 100 may include a first input tri-state inverter 11, a first master latch tri-state inverter 12, and a first inverter 13.

The master latch 100 may store the data signal D which is input via the node MA, and may output the data signal D to a node SA. For example, the master latch 100 may output the input data signal D, on the basis of a first clock signal CK and a second clock signal CKN obtained by inversion of the first clock signal CK.

For example, the first input tri-state inverter 11 may receive the input of the data signal D from the node MA, and may invert and output the data signal D to the node SA when the first clock signal CK is a logic low (L), and the second clock signal CKN is a logic high (H). Conversely, when the first clock signal CK is a logic high (H) and the second clock signal CKN is a logic low (L), the first input tri-state inverter 11 may block the first master latch tri-state inverter 12 from the node MA.

An output terminal of the first master latch tri-state inverter 12 may be connected to an output terminal of the first input tri-state inverter 11. The first master latch tri-state inverter 12 may invert the output signal provided from the first input tri-state inverter 11 and output the inverted output signal to the node SA.

For example, when the clock signal CK is a logic high (H) and the second clock signal CKN is a logic low (L), the first master latch tri-state inverter 12 may invert the signal, which is output from the first inverter 13 to a node MB, and may output the inverted signal to the node SA. Conversely, when the first clock signal CK is a logic low (L) and the second clock signal CKN is a logic high (H), the first master latch tri-state inverter 12 may block the first input tri-state inverter 11 from the node SA.

The slave latch 200 may include a second input tri-state inverter 21, a second master latch tri-state inverter 22, and a second inverter 13. The slave latch 200 may operate similarly to the master latch 100 circuit described above.

For example, the slave latch 200 may store the data signal D which is input via the node SA, and may output the data signal D to a node SC. The slave latch 200 may output the data signal D which is input to the node SA on the basis of the first clock signal CK and the second clock signal CKN. The data signal which is output to the node SC is inverted by a fourth inverter 41 and is output as an output signal Q.

For example, the second input tri-state inverter 21 receives the input of the data signal D from the node SA, and when the first clock signal CK is a logic high (H), and the second clock signal CKN is a logic low (L), the second input tri-state inverter 21 may invert the data signal D and output the inverted data signal to the node SA. Conversely, when the first clock signal CK is a logic low (L) and the second clock signal CKN is a logic high (H), the second input tri-state inverter 21 may block the first master latch tri-state inverter 22 from the node SA.

The second master latch tri-state inverter 22 may be connected to the output terminal of the second input tri-state inverter 21. The second master latch tri-state inverter 22 may invert the output signal provided from the second input tri-state inverter 21 and output the inverted output signal to the node SC.

For example, when the first clock signal CK is a logic low (L) and the second clock signal CKN is a logic high (H), the second master latch tri-state inverter 22 may invert the signal, which is output from the second inverter 23 to the node SB, and may output the inverted output signal to the node SC. Conversely, when the first clock signal CK is a logic high (H) and the second clock signal CKN is a logic low (L), the second master latch tri-state inverter 22 may block the second input tri-state inverter 21 from the node SA.

The master-slave flip flop according to an exemplary embodiment may receive the first clock signal CK and the second clock signal CKN. As illustrated in FIG. 2, the first clock signal CK and the second clock signal CKN may be provided to the master-slave flip flop through a single inverter. In other words, the first clock signal CK is directly provided from the clock terminal, for example, without passing through a buffer circuit including a plurality of inverters, and the second clock signal CKN may be input as a clock signal obtained by inverting the first clock signal CK via the third inverter 31.

When the master-slave flip flop according to an exemplary embodiment of the inventive concept receives the first clock signal CK that is not buffered directly from the clock terminal, and receives the second clock signal CKN, several effects may occur.

First, power consumption may be reduced because only one inverter 31 is used for providing the first clock signal CK and the second clock signal CKN. In other words, as the number of inverters which receive the clock signal that rapidly transits between the logic high (H) and the logic low (L) increases, the power consumption of the overall circuit increases. Since the master-slave flip flop according to an exemplary embodiment of the inventive concept includes only one clock inverter used to generate the first clock signal CK and the second clock signal CKN, the master-slave flip flop may have relatively low power consumption.

On the other hand, capacitance may affect high-speed operation characteristics of the master-slave flip flop. In particular, as compared to a circuit element (e.g., the third inverter 31) directly exposed to the second clock signal CKN, the number of circuit elements (e.g., the first master latch tri-state inverter 12, the second master latch tri-state inverter 22, etc.) directly exposed to the first clock signal CK is large. Thus, the capacitance of the gate terminal connected to the first clock signal CK may appear to be large.

The master-slave flip flop according to an exemplary embodiment of the inventive concept provides a layout for minimizing an influence on the circuit due to such capacitance differences. This will be described in detail below.

FIGS. 3A through 3D are circuit diagrams of tri-state inverters included in the master-slave flip flop of FIG. 2 according to exemplary embodiments of the inventive concept.

Figure 3A:
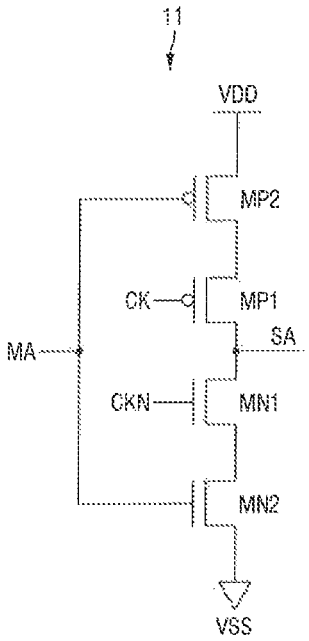
FIGS. 3A through 3D are circuit diagrams of tri-state inverters included in the master-slave flip flop of FIG. 2 according to exemplary embodiments of the inventive concept.

First, referring to FIG. 3A, the first input tri-state inverter 11 may include first and second NMOS transistors MN1 and MN2, and first and second PMOS transistors MP1 and MP2. The transistors may be disposed in series between a power supply voltage VDD and a ground voltage VSS.

Since the operation of the first tri-state inverter 11 has been described above in detail, it will not be described again. The output of the data signal D, which is input to the node MA, to the node SA may be controlled by the first PMOS transistor MP1 and the first NMOS transistor MN1 gated by the first clock signal CK and the second clock signal CKN, respectively.

Figure 3B:
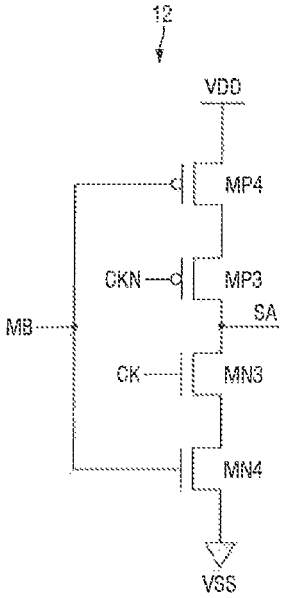

Referring to FIG. 3B, the first master latch tri-state inverter 12 may include third and fourth NMOS transistors MN3 and MN4, and third and fourth PMOS transistors MP3 and MP4. The transistors may be disposed in series between the power supply voltage VDD and the ground voltage VSS.

The configuration of the first master latch tri-state inverter 12 is also substantially the same as that described above. The output of the data signal D, which is input to the node MB, to the node SA may be controlled by the third NMOS transistor MN3 and the third PMOS transistor MP3 gated by the first clock signal CK and the second clock signal CKN, respectively.

Figure 3C:
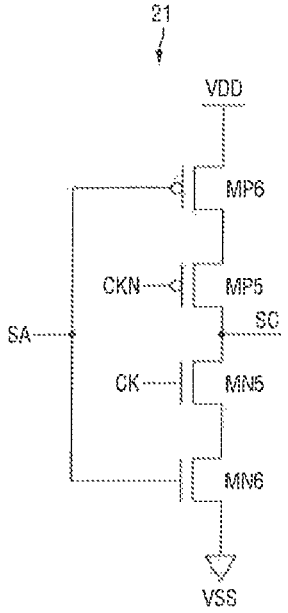

Referring to FIG. 3C, the second input tri-state inverter 21 includes fifth and sixth NMOS transistors MN5 and MN6, and fifth and sixth PMOS transistors MP5 and MP6 connected in series between the power supply voltage VDD and the ground voltage VSS.

In the second input tri-state inverter 21, the output of the data signal D, which is input to the node SA, to the node SC may be controlled by the fifth NMOS transistor MN5 and the fifth PMOS transistor gated by the first clock signal CK and the second clock signal CKN, respectively.

Figure 3D:
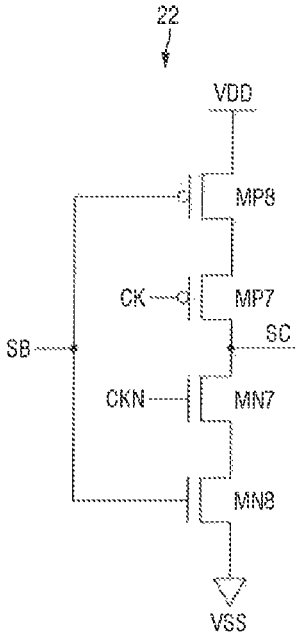

Referring to FIG. 3D, the second master latch tri-state inverter 22 may include seventh and eighth NMOS transistors MN7 and MN8, and seventh and eighth PMOS transistors MP7 and MP8 connected in series between the power supply voltage VDD and the ground voltage VSS.

In the second master latch tri-state inverter 22, the output of the data signal D, which is input to the node SB, to the node SC may be controlled by the seventh PMOS transistor MP7 and the seventh NMOS transistor MN7 gated by the first clock signal CK and the second clock signal CKN, respectively.

Figure 4A:
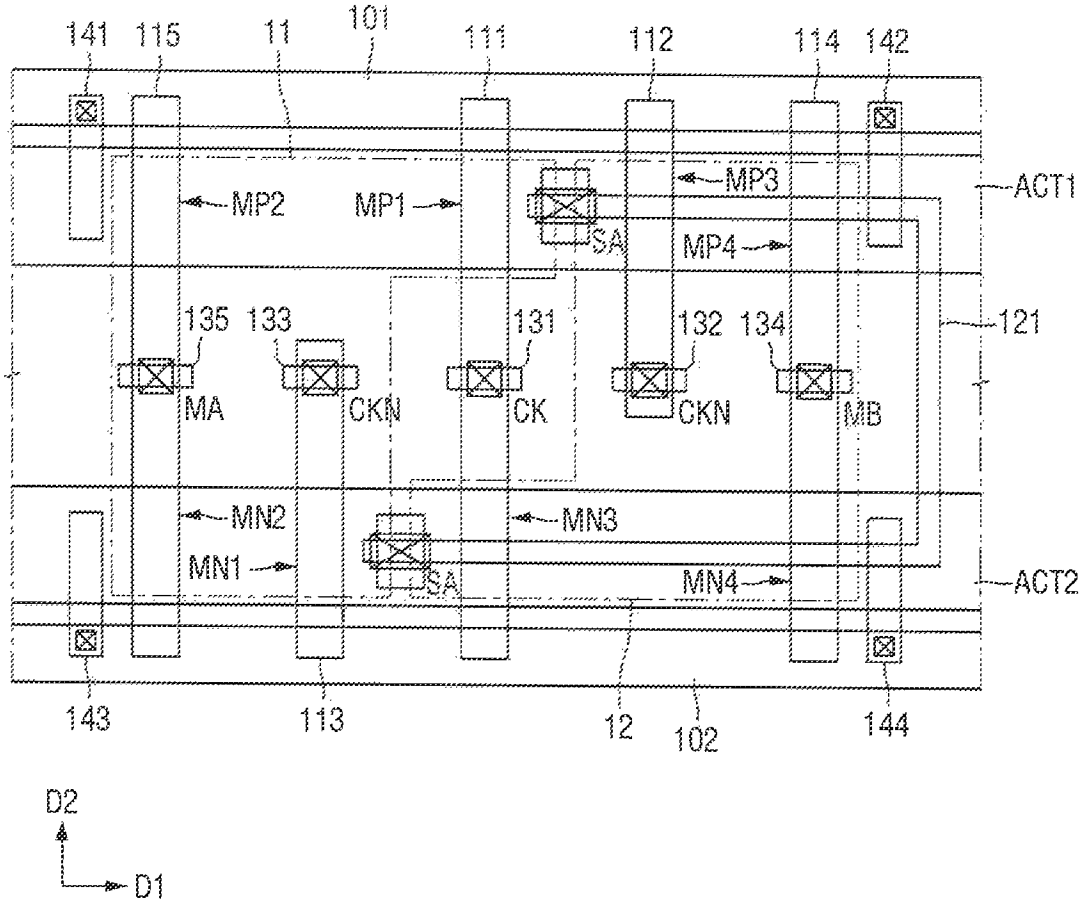
FIGS. 4A and 4B are layout diagrams of a master latch and a slave latch included in the master-slave flip flop of FIG. 2 according to exemplary embodiments of the inventive concept.
Figure 4B:
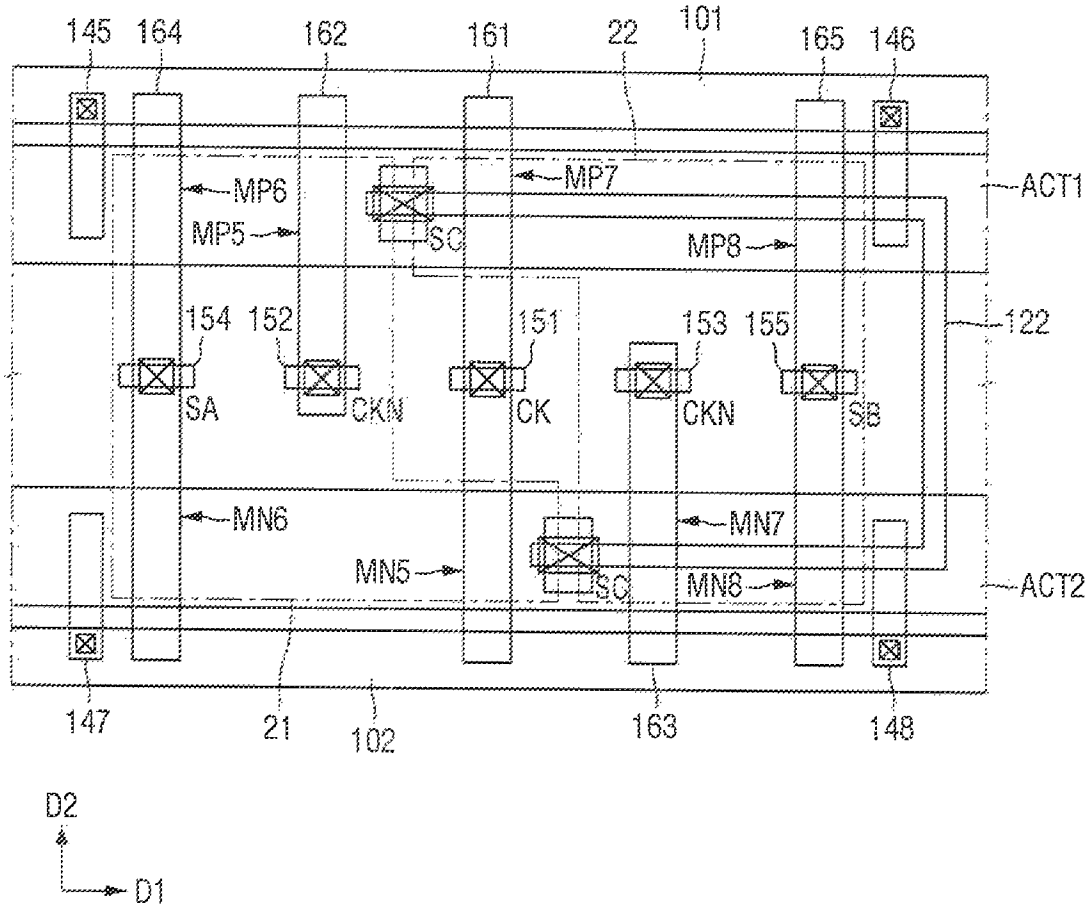

FIG. 4A is a layout diagram of a master latch included in the master-slave flip flop of FIG. 2 according to an exemplary embodiment of the inventive concept, and FIG. 4B is a layout diagram of a slave latch included in the master-slave flip flop of FIG. 2 according to an exemplary embodiment of the inventive concept. For simplicity of explanation, FIG. 4A illustrates only the layout of the first input tri-state inverter 11 and the first master latch tri-state inverter 12 which receive the first clock signal CK and the second clock signal CKN, and FIG. 4B illustrates only the layout of the second input tri-state inverter 21 and the second master latch tri-state inverter 22.

Referring to FIG. 4A, the master latch 100 may include the first through fourth NMOS transistors MN1 through MN4, and the first through fourth PMOS transistors MP1 through MP4 connected between a first power rail 101 and a second power rail 102.

The first power rail 101 and the second power rail 102 may extend in a first direction D1. For example, the first power rail 101 may transmit the power supply voltage VDD, and the second power rail 102 may transmit the ground voltage VSS rail, but are not limited thereto. In the following description, it is assumed that the first power rail 101 provides the power supply voltage VDD and the second power rail 102 provides the ground voltage VSS.

A first active region ACT1 and a second active region ACT2 may be defined on a substrate. Each of the first active region ACT1 and the second active region ACT2 may extend in the first direction D1 and may be spaced apart from each other in a second direction D2 crossing the first direction D1. An element isolation region may be formed between the first active region ACT1 and the second active region ACT2.

In an exemplary embodiment of the inventive concept, the first active region ACT1 may be a region containing a P-type impurity, and the second active region ACT2 may be a region containing an N-type impurity. Therefore, a PMOS transistor may be formed on the first active region ACT1, and an NMOS transistor may be formed on the second active region ACT2.

A first gate line 111 may extend in the second direction D2 and may overlap each of the first active region ACT1 and the second active region ACT2. The first gate line 111 overlaps the first active region ACT1 to form the first PMOS transistor MP1. The first gate line 111 overlaps the second active region ACT2 to form the third NMOS transistor MN3. As the first gate line 111 overlaps the first active region ACT1 and the second active region ACT2 and extends in the second direction D2, the first PMOS transistor MP1 and the third NMOS transistor MN3 formed on the first active region ACT1 and the second active region ACT2, respectively, may also be aligned in the second direction D2.

The first gate line 111 may receive the first clock signal CK via a metal 131. In other words, as illustrated in FIGS. 3A and 3B, the first PMOS transistor MP1 and the third NMOS transistor MN3, which are gated via the first clock signal CK, may receive the first clock signal CK through the first gate line 111. The first PMOS transistor MP1 and the third NMOS transistor MN3 may share the first gate line 111.

A second gate line 112 and a third gate line 113 may be disposed on both sides of the first gate line 111.

The second gate line 112 may be disposed to be spaced apart from the first gate line 111 in the first direction D1 and to extend in the second direction D2. The second gate line 112 may overlap the first active region ACT1 to form the third PMOS transistor MP3. The second gate line 112 may not overlap the second active region ACT2. The second gate line 112 may receive the second clock signal CKN through a metal 132.

The third gate line 113 may be disposed to be spaced apart from the first gate line 111 in the first direction D1 and to extend in the second direction D2. The third gate line 113 may overlap the second active region ACT2 to form the first NMOS transistor MN1. The third gate line 113 may not overlap the first active region ACT1. The third gate line 113 may receive the second clock signal CKN through a metal 133.

As illustrated in FIG. 4A, the first gate line 111, to which the first clock signal CK is applied, is larger in the length in the second direction D2 than the second gate line 112 and the third gate line 113 to which the second clock signal CKN is applied. As a result, the magnitude of parasitic capacitance formed by the first gate line 111 is smaller than the magnitude of parasitic capacitance formed by the second gate line 112 or the third gate line 113.

In FIG. 4A, although the metals 131 through 133 are illustrated as being partially omitted, there is also a difference in the loading capacitance due to a difference between the length of the metal 131 formed on the first gate line 111 and the length of the two metals 132 and 133 formed on the second gate line 112 and the third gate line 113. In other words, the loading capacitance indicated by the second gate line 112 and the third gate line 113 is larger than the loading capacitance indicated by the first gate line 111.

In summary, in the master flip flop circuit according to an exemplary embodiment of the inventive concept, the first gate line 111 receiving the first clock signal CK extends in the second direction D2 so as to overlap both of the first active region ACT1 and the second active region ACT2. The second gate line 112 and the third gate line 113 receiving the second clock signal CKN are disposed on first and second sides of the first gate line 111, respectively, and the length of the second gate line 112 and the third gate line 113 in the second direction D2 is smaller than that of the first gate line 111. This makes it possible to compensate for the capacitance difference between the input terminal of the first clock signal CK and the input terminal of the second clock signal CKN as seen from the clock terminal described above.

In an exemplary embodiment of the inventive concept, the distance in the first direction D1 between the first gate line 111 and the second gate line 112 may be substantially the same as the distance in the first direction D1 between the first gate line 111 and the third gate line 113.

The first NMOS transistor MN1 and the third NMOS transistor MN3 may share a drain region. The shared drain region of the first NMOS transistor MN1 and the third NMOS transistor MN3 may be connected to the node SA which is the output of the master latch 100.

The first PMOS transistor MP1 and the third PMOS transistor MP3 may share a drain region. The shared drain region of the first PMOS transistor MP1 and the third PMOS transistor MP3 may be connected to the node SA. The shared drain region of the first NMOS transistor MN1 and the third NMOS transistor MN3 may be electrically connected to the shared drain region of the first NMOS transistor MN1 and the third PMOS transistor MP3, by a metal line 121.

A fourth gate line 114 may be disposed to be spaced apart from the second gate line 112 in the first direction D1. The fourth gate line 114 may extend in the second direction D2 and may overlap each of the first active region ACT1 and the second active region ACT2. The fourth gate line 114 may be connected to the node MB, which is the input terminal of the first master latch tri-state inverter 12, through a metal 134.

The fourth gate line 114 overlaps the first active region ACT1 to form the fourth PMOS transistor MP4. The fourth gate line 114 overlaps the second active region ACT2 to form the fourth NMOS transistor MN4. The fourth PMOS transistor MP4 and the fourth NMOS transistor MN4 may be aligned in the second direction D2.

The power supply voltage VDD may be provided to the source region of the fourth PMOS transistor MP4 by a metal 142. Additionally, the ground voltage VSS may be provided to the source region of the fourth NMOS transistor MN4 by a metal 144.

The fifth gate line 115 may be disposed to be spaced apart from the third gate line 113 in the first direction D1. The fifth gate line 115 may extend in the second direction D2 and may overlap each of the first active region ACT1 and the second active region ACT2. The fifth gate line 115 may be connected to the node MA, which is an input terminal of the first input tri-state inverter 11, through a metal 135.

The fifth gate line 115 overlaps the first active region ACT1 to form the second PMOS transistor MP2. The fifth gate line 115 overlaps the second active region ACT2 to form the second NMOS transistor MN2. The second PMOS transistor MP2 and the second NMOS transistor MN2 may be aligned in the second direction D2.

The power supply voltage VDD may be provided to the source region of the second PMOS transistor MP2 by a metal 141. Additionally, the ground voltage VSS may be provided to the source region of the second NMOS transistor MN2 by a metal 143.

Referring to FIG. 4B, the slave latch 200 may include the fifth through eighth NMOS transistors MN5 through MN8, and the fifth through eighth PMOS transistors MP5 through MP8 disposed between the first power rail 101 and the second power rail 102.

The sixth gate line 161 may extend in the second direction D2 and may overlap each of the first active region ACT1 and the second active region ACT2. The sixth gate line 161 overlaps the first active region ACT1 to form the seventh PMOS transistor MP7. The sixth gate line 161 overlaps the second active region ACT2 to form the fifth NMOS transistor MN5. The seventh PMOS transistor MP7 and the fifth NMOS transistor MN5 may share the sixth gate line 161. The first clock signal CK may be provided to the sixth gate line 161 through a metal 151.

A seventh gate line 162 and an eighth gate line 163 may be disposed on both sides of the sixth gate line 161.

The seventh gate line 162 may be disposed to be spaced apart from the sixth gate line 161 in the first direction D1 and to extend in the second direction D2. The seventh gate line 162 may overlap the first active region ACT1 to form the fifth PMOS transistor MP5. The seventh gate line 162 may not overlap the second active region ACT2. The second clock signal 132 may be provided to the seventh gate line 162 through a metal 152.

The eighth gate line 163 may be disposed to be spaced apart from the sixth gate line 161 in the first direction D1 and to extend in the second direction D2. The eighth gate line 163 may overlap the second active region ACT2 to form the seventh NMOS transistor MN7. The eighth gate line 173 may not overlap the first active region ACT1. The second clock signal CKN may be provided to the eighth gate line 173 via a metal 153.

A shared drain region of the fifth PMOS transistor MP5 and the seventh PMOS transistor MP7 connected to the node SC may be electrically connected to a shared drain region of the fifth NMOS transistor MN5 and the seventh NMOS transistor MN7 connected to the node SC, via a metal line 122.

As in the master latch 100 of FIG. 4A, the sixth gate line 161, to which the first clock signal CK is applied, is longer in the length in the second direction D2 than the seventh gate line 162 and the eighth gate line 163 to which the second clock signal CKN is applied. Accordingly, the magnitude of parasitic capacitance formed by the sixth gate line 161 may be smaller than the magnitude of parasitic capacitance formed by the seventh gate line 162 or the eighth gate line 163.

Additionally, the fact that the loading capacitance indicated by the sixth gate line 161 is smaller than the loading capacitance indicated by the seventh gate line 162 and the eighth gate line 163 is similar to the relationship among the first gate line 111, the second gate line 112, and the third gate line 113 in the master latch 100.

Therefore, the configuration of the slave latch 200 may compensate for the capacitance difference between the input terminal of the first clock signal CK and the input terminal of the second clock signal CKN.

A ninth gate line 164 may be disposed to be spaced apart from the seventh gate line 162 in the first direction D1. The ninth gate line 164 extends in the second direction D2, overlaps the first active region ACT1 to form the sixth PMOS transistor MP6, and overlaps the second active region ACT2 to form the sixth NMOS transistor MN6. The sixth PMOS transistor MP6 is connected to the first power rail 101 through a metal 145. The sixth NMOS transistor MN6 is connected to the second power rail 102 through a metal 147. The ninth gate line 164 may be connected to the node SA through a metal 154.

A tenth gate line 165 may be disposed to be spaced apart from the eighth gate line 163 in the first direction D1. The tenth gate line 165 extends in the second direction D2, overlaps the first active region ACT1 to form the eighth PMOS transistor MP8, and overlaps the second active region ACT2 to form the eighth NMOS transistor MN8. The eighth PMOS transistor MP8 may be connected to the first power rail 101 through a metal 146. The eighth NMOS transistor MN8 may be connected to the second power rail 102 through a metal 148. The tenth gate line 165 may be connected to the node SB through a metal 155.

The master latch 100 and the slave latch 200 may be disposed in order in the first direction D1. In other words, the master latch 100 and the slave latch 200 share the first power rail 101 and the second power rail 102, and may be disposed to be adjacent to each other in the first direction D1. In an exemplary embodiment of the inventive concept, additional constituent elements may be additionally disposed between the master latch 100 and the slave latch 200.

Figure 5A:
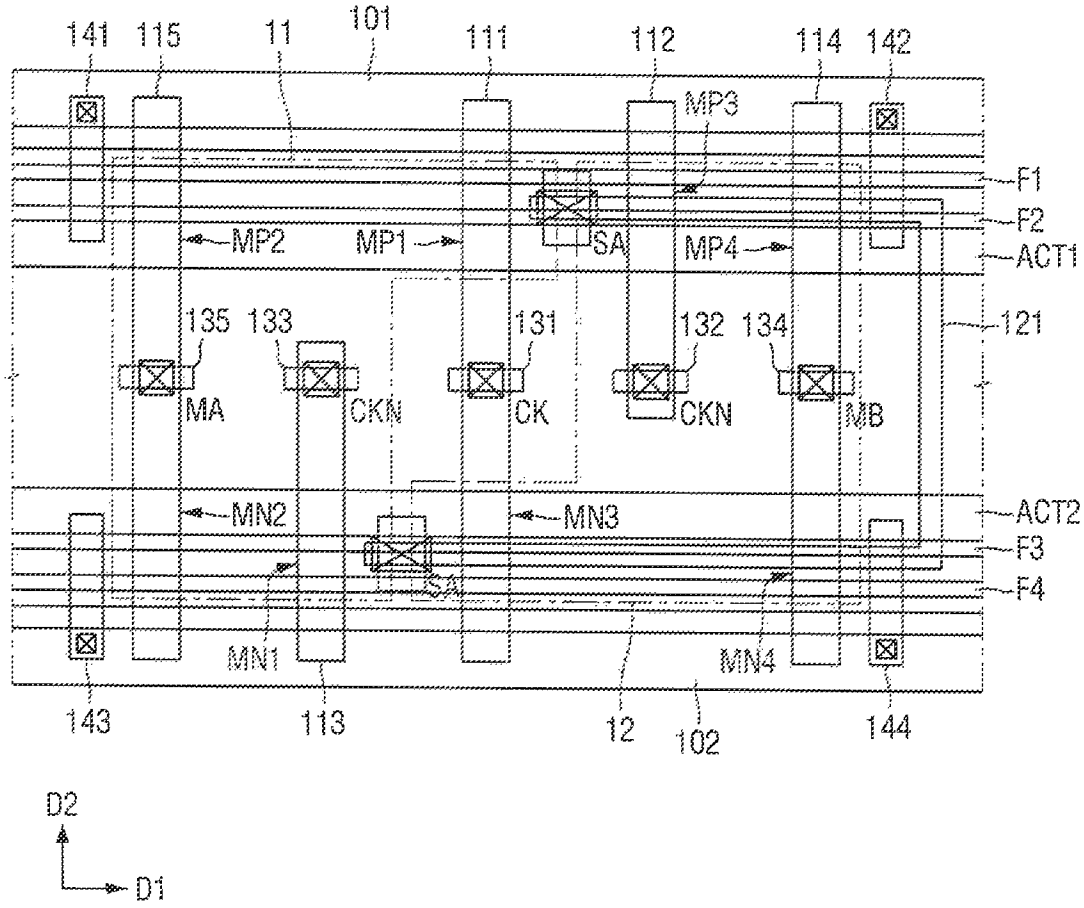
FIGS. 5A and 5B are layout diagrams of the master latch and the slave latch included in the master-slave flip flop of FIG. 2 according to exemplary embodiments of the inventive concept.
Figure 5B:
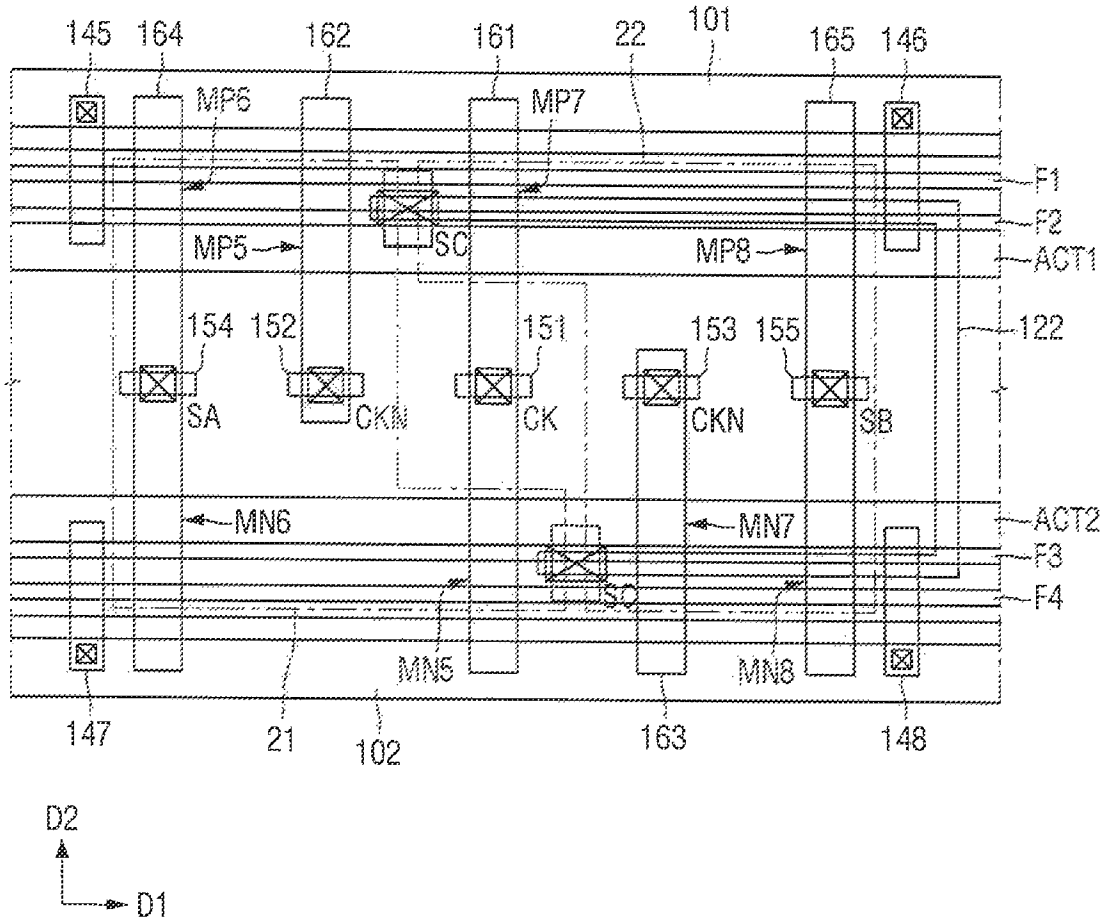

FIG. 5A is a layout diagram of the master latch included in the master-slave flip flop of FIG. 2 according to an exemplary embodiment of the inventive concept, and FIG. 5B is a layout diagram of the slave latch included in the master-slave flip flop of FIG. 2 according to an exemplary embodiment of the inventive concept. Same or similar parts as those in the aforementioned examples will be omitted and the differences will be mainly described.

Referring to FIGS. 5A and 5B, the master latch 100 and the slave latch 200 may further include a first fin F1 and a second fin F2 formed on the first active region ACT1, and a third fin F3 and a fourth fin F4 formed on the second active region ACT2.

The first and second fins F1 and F2 may protrude from the substrate in the first active region ACT1 to extend in the first direction D1. The third and fourth fins F3 and F4 may protrude from the substrate in the second active region ACT2 to extend in the first direction D1.

In FIGS. 5A and 5B, it is assumed that two fins are formed in one active region, but this is only an example, and the inventive concept is not limited thereto. For example, one or more than two fins may be formed in one active region.

The first through eighth NMOS transistors MN1 through MN8, and the first through eighth PMOS transistors MP1 through MP8 may function as fin type transistors by including the first through fourth fins F1 through F4.

FIG. 6 is a circuit diagram of a master-slave flip flop according to an exemplary embodiment of the inventive concept.

Referring to FIG. 6, a circuit diagram of a multi-bit master-slave flip flop is illustrated. In an exemplary embodiment of the inventive concept, the master-slave flip flop may store a plurality of data signals D0 and D1, and may output the data signals in response to a control signal.

The master-slave flip flop may include a scan circuit 1300, a first master latch circuit 100, a first slave latch circuit 200, a second master latch circuit 1100, and a second slave latch circuit 1200.

The scan circuit 1300 may include an inverter 1312, and first through fourth scan tri-state inverters 1311, 1313, 1314, and 1315. The scan circuit 1300 may receive the first and second data signals D0 and D1, first and second scan input signals SI0 and SI1, and the scan enable signal SE. The scan circuit 1300 may output either the first data signal D0 or the first scan input signal SI0 to a node MA0 in accordance with the control signal. The scan circuit 1300 may output either the second data signal D1 or the second scan input signal SI1 to a node MA1 in accordance with the control signal.

The scan circuit 1300 may operate similarly to the scan circuit 300 described above with reference to FIG. 2, except that it simultaneously processes two bits. In other words, the scan circuit 1300 may selectively output the first data signal D0 and the first scan input signal SI0 to the node MA0 in accordance with the level of the scan enable signal SE, and may selectively output the second data signal D1 and the second scan input signal SI1 to the node MA1 in accordance with the level of the scan enable signal SE.

The configuration of the scan circuit 1300 illustrated in FIG. 6 is an example, and the inventive concept is not limited thereto. The scan circuit 1300 may be provided as, for example, a plurality of transmission gates or multiplexers.

The first master latch circuit 100 and the first slave latch circuit 200 store the first data signal D0, and output the first data signal D0 as a first output signal Q0 by a control signal. The second master latch circuit 100 and the second slave latch circuit 200 store the second data signal D1 and output the second data signal D1 as a second output signal Q1 by a control signal. The first master latch circuit 100, the first slave latch circuit 200, the second master latch circuit 1100, and the second slave latch circuit 1200 may share the first clock signal CK and the second clock signal CKN.

Since the configuration and operation of the first master latch circuit 100 and the first slave latch circuit 200 are substantially the same as those of the master latch 100 and the slave latch 200 described above with reference to FIG. 2, a detailed description thereof will not be provided. Nodes MB0 and MB1, SA0 and SA1, SC0 and SC1, and SB0 and SB1 may be similar to the nodes MB, SA, SC, and SB of FIG. 2.

The second master latch 1100 may include a third input tri-state inverter 14, a third master latch tri-state inverter 15, and a fourth inverter 16.

The second master latch 1100 is similar to the operation and configuration of the first master latch 100, except that the second master latch 1100 outputs the second data signal D1 rather than the first data signal D0 to the node SA1 on the basis of the first clock signal CK and the second clock signal CKN. Thus, the description on the operation and configuration of the first master latch 100 may be applied to that of the second master latch 1100.

The second slave latch 1200 may include a fourth input tri-state inverter 24, a fourth slave latch tri-state inverter 25, and a fifth inverter 26.

The second slave latch 1200 is similar to the operation and configuration of the first slave latch 200, except that the second slave latch 1200 outputs the second data signal D1 rather than the first data signal D0 to the node SC1 on the basis of the first clock signal CK and the second clock signal CKN. Thus, the description on the operation and configuration of the first slave latch 200 may be applied to that of the second slave latch 1200.

The master-slave flip flop according to the present exemplary embodiment also receives the first clock signal CK directly from the output terminal, without passing through a buffering circuit. The first clock signal CK may be inverted by the inverter 31 to provide the second clock signal CKN.

FIGS. 7A through 7D are circuit diagrams of tri-state inverters included in the master-slave flip flop of FIG. 6 according to exemplary embodiments of the inventive concept.

Figure 7A:
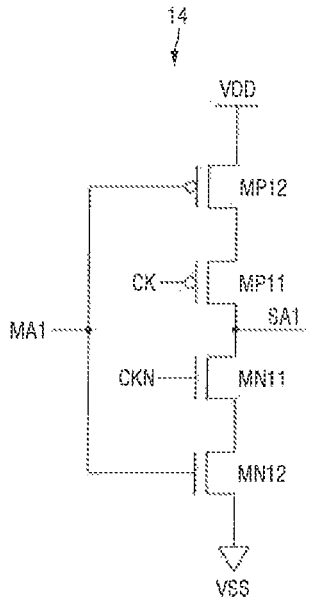
FIGS. 7A through 7D are circuit diagrams of tri-state inverters included in the master-slave flip flop of FIG. 6 according to exemplary embodiments of the inventive concept.

Referring to FIG. 7A, the third input tri-state inverter 14 may include eleventh and twelfth NMOS transistors MN11 and MN12, and eleventh and twelfth PMOS transistors MP11 and MP12. The transistors may be disposed in series between the power supply voltage VDD and the ground voltage VSS.

Figure 7B:
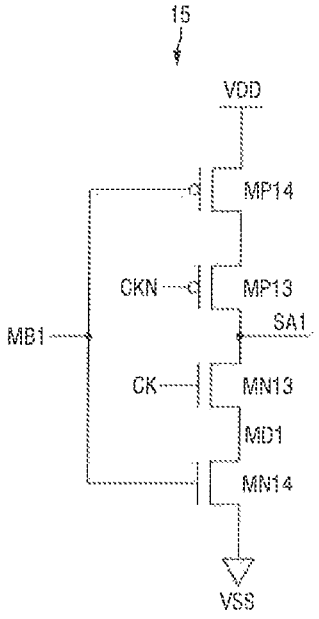

Referring to FIG. 7B, the third master latch tri-state inverter 15 may include thirteenth and fourteenth NMOS transistors MN13 and MN14, and thirteenth and fourteenth PMOS transistors MP13 and MP14. The transistors may be disposed in series between the power supply voltage VDD and the ground voltage VSS.

Figure 7C:
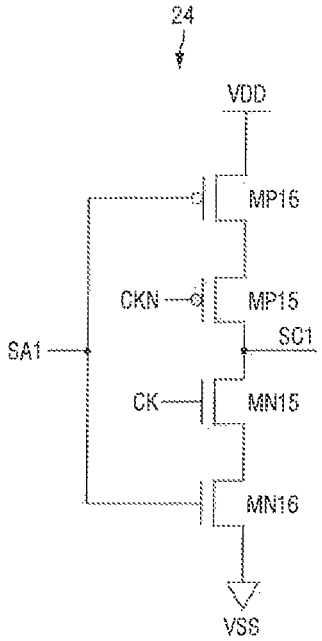

Referring to FIG. 7C, the fourth input tri-state inverter 24 may include fifteenth and sixteenth NMOS transistors MN15 and MN16, and fifteenth and sixteenth PMOS transistors MP15 and MP16. The transistors may be disposed in series between the power supply voltage VDD and the ground voltage VSS.

Figure 7D:
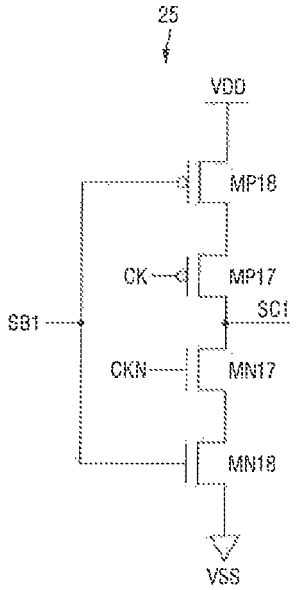

Referring to FIG. 7D, the fourth slave latch tri-state inverter 25 may include seventeenth and eighteenth NMOS transistors MN17 and MN18, and seventeenth and eighteenth PMOS transistors MP17 and MP18. The transistors may be disposed in series between the power supply voltage VDD and the ground voltage VSS.

Since the configurations of the third and fourth input tri-state inverters 14 and 24, and the third and fourth slave latch tri-inverters 15 and 25 are similar to the configurations of the first and second input tri-state inverters 11 and 21, and the third and fourth slave latch tri-inverters 15 and 25 described with reference to FIGS. 3A through 3D, a detailed description thereof will not be provided.

Figure 8A:
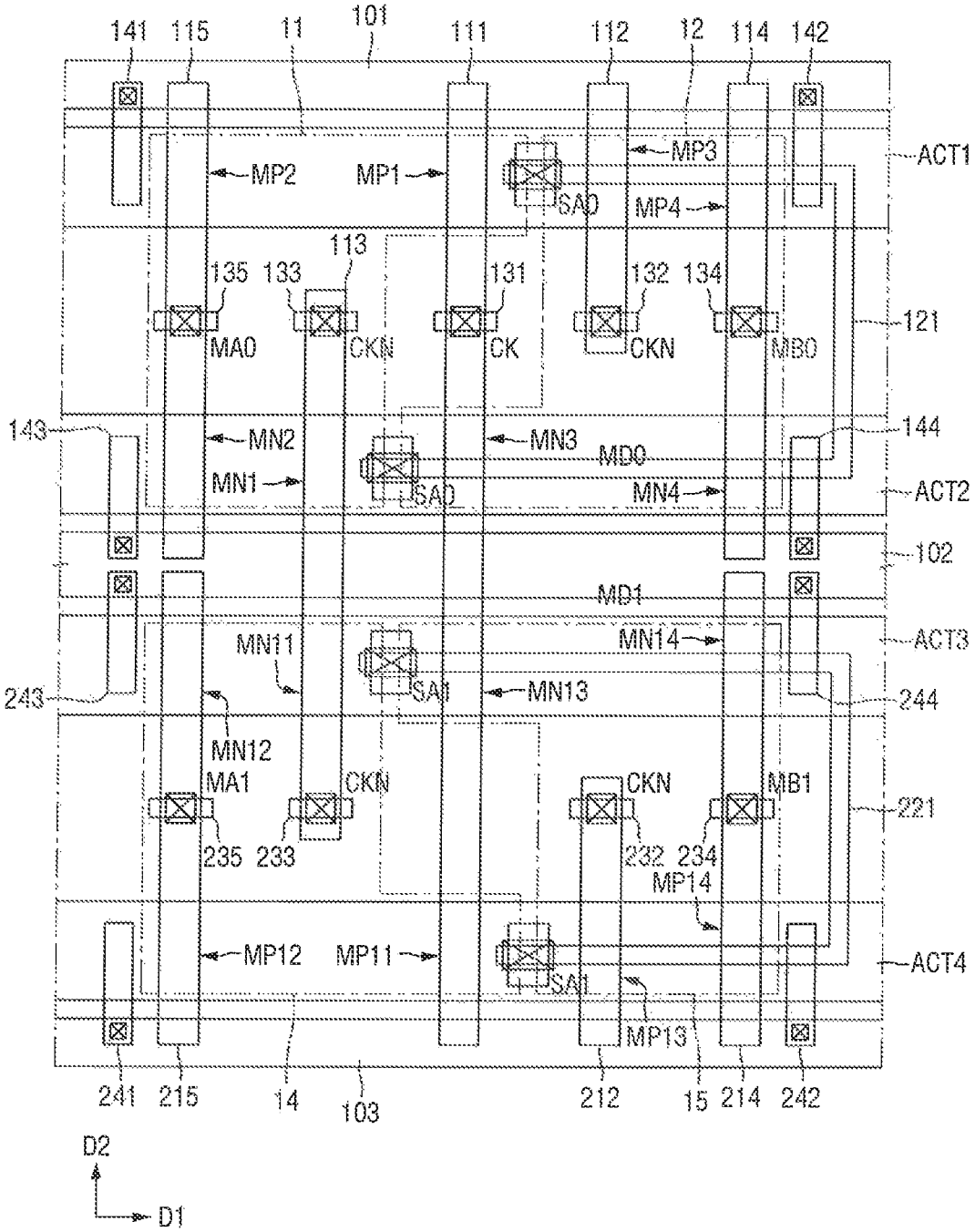
FIG. 8A is a layout diagram of a first master latch and a second master latch included in the master-slave flip flop of FIG. 6 according to an exemplary embodiment of the inventive concept.
Figure 8B:
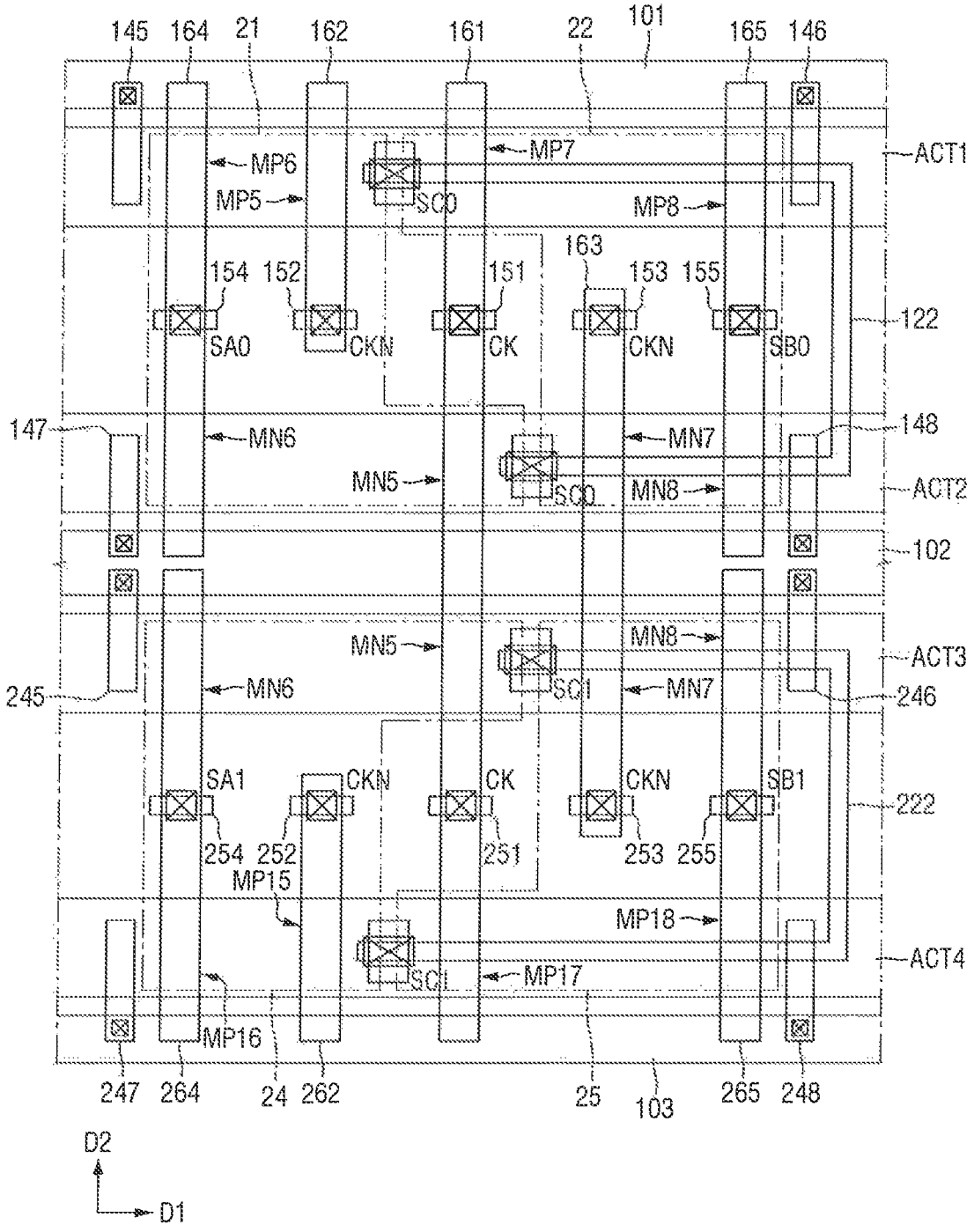
FIG. 8B is a layout diagram of a first slave latch and a second slave latch included in the master-slave flip flop of FIG. 6 according to an exemplary embodiment of the inventive concept.

FIG. 8A is a layout diagram of a first master latch and a second master latch included in the master-slave flip flop of FIG. 6 according to an exemplary embodiment of the inventive concept, and FIG. 8B is a layout diagram of a first slave latch and a second slave latch included in the master-slave flip flop of FIG. 6 according to an exemplary embodiment of the inventive concept. For simplicity of explanation, FIG. 8A illustrates only the layout of the first and third input tri-state inverters 11 and 14 and the first and third master latch tri-state inverters 12 and 15 which receive the first clock signal CK and the second clock signal CKN. FIG. 8B illustrates only the layout of the second and fourth input tri-state inverters 21 and 24, and the second and fourth master latch tri-state inverters 22 and 25.

Referring to FIG. 8A, the first master latch 100 may include the first through fourth NMOS transistors MN1 through MN4, and the first through fourth PMOS transistors MP1 through MP4 disposed between the first power rail 101 and the second power rail 102. The second master latch 1100 may include the eleventh through fourteenth NMOS transistors MN11 through MN14, and the eleventh through fourteenth PMOS transistors MP11 through MP14 disposed between the second power rail 102 and a third power rail 103. The second master latch 1100 may have a configuration similar to that of the first master latch 100. The second master latch 1100 may include metals 232, 233, 234, 235, 241, 242, 243, and 244, and a metal line 221.

Further, the master-slave flip flop may include first through fourth active regions ACT1 through ACT4 which extend in the first direction D1 and are spaced apart from one another in the second direction D2 on the substrate. In an exemplary embodiment of the inventive concept, the first and fourth active regions ACT1 and ACT4 may be P-type impurity regions, and the second and third active regions ACT2 and ACT3 may be N-type impurity regions.

The first master latch 100 and the second master latch 1100 may share the second power rail 102. The ground voltage VSS may be supplied to the first master latch 100 and the second master latch 1100 from the second power rail 102.

The first gate line 111 may extend in the second direction D2. The first gate line 111 may overlap the first through fourth active regions ACT1 through ACT4. The configuration in which the first gate line 111 constitutes the first PMOS transistor MP1 and the third NMOS transistor MN3 is substantially the same as the embodiment described above with reference to FIG. 4B. In addition, the first gate line 111 overlaps the third active region ACT3 to form the thirteenth NMOS transistor MN13, and overlaps the fourth active region ACT4 to form the eleventh PMOS transistor MP11. The first clock signal CK is applied to the first gate line 111 by the metal 131.

The second gate line 112 may be disposed to be spaced apart from the first gate line 111 in the first direction D1 and to extend in the second direction D2. The second gate line 112 may overlap the first active region ACT1 to form the third PMOS transistor MP3.

An eleventh gate line 212 may be disposed to be spaced apart from the first gate line 111 in the first direction D1 and to extend in the second direction D2. The eleventh gate line 212 may overlap the fourth active region ACT4 to form the thirteenth PMOS transistor MP13. The eleventh gate line 212 and the second gate line 112 may be disposed to be aligned in the second direction D2.

The third gate line 113 may be disposed to be spaced apart from the first gate line 111 in the first direction D1 and to extend in the second direction D2. The third gate line 113 may overlap the second active region ACT2 to form the first NMOS transistor MN1, and may overlap the third active region ACT3 to form the eleventh NMOS transistor MN11. The third gate line 113 may not overlap the first active region ACT1 and the fourth active region ACT4. The second clock signal CKN may be provided to the third gate line 113 via the metals 133 and 233.

Similar to the previous embodiment, the lengths in the second direction D2 of the second gate line 112, the third gate line 113, and the eleventh gate line 212, to which the second clock signal CKN is supplied, is smaller than the length in the second direction D2 of the first gate line 111 to which the first clock signal CK is supplied. As a result, the magnitude of parasitic capacitance formed by the first gate line 111 is smaller than the magnitude of parasitic capacitance formed by the second, third, and eleventh gate lines 112, 113, and 212.

A thirteenth gate line 215 is disposed to be spaced apart from the third gate line 113 in the first direction D1. The thirteenth gate line 215 may overlap the third active region ACT3 to form the twelfth NMOS transistor MN12, and may overlap the fourth active region ACT4 to form the twelfth PMOS transistor MP12. The thirteenth gate line 215 may be disposed to be aligned with the fifth gate line 115 in the second direction D2. The ground voltage VSS may be provided to the twelfth NMOS transistor MN12 through the metal 243, and the power supply voltage VDD may be provided to the twelfth PMOS transistor MP12 through the metal 241.

A twelfth gate line 214 may be disposed to be spaced apart from the eleventh gate line 212 in the first direction D1. The twelfth gate line 214 may overlap the third active region ACT3 to form the fourteenth NMOS transistor MN14, and may overlap the fourth active region ACT4 to form the fourteenth PMOS transistor MP14. The twelfth gate line 214 may be disposed to be aligned with the fourth gate line 114 in the second direction D2. The ground voltage VSS may be provided to the fourteenth NMOS transistor MN14 through the metal 244, and the power supply voltage VDD may be provided to the fourteenth PMOS transistor MP14 through the metal 242.

As illustrated in FIG. 8A, the first master latch 100 and the second master latch 1100 may be disposed in order in the second direction D2.

Referring to FIG. 8B, the first slave latch 200 may include the fifth through eighth NMOS transistors MN5 through MN8, and the fifth through eighth PMOS transistors MP5 through MP8 which are disposed between the first power rail 101 and the second power rail 102. The second slave latch 1200 may include the fifteenth through eighteenth NMOS transistors MN15 through MN18, and the fifteenth through eighteenth PMOS transistors MP15 through MP18 which are disposed between the second power rail 102 and the third power rail 103. The second slave latch 1200 may have a configuration similar to that of the first slave latch 200. The second slave latch 1200 may include metals 251, 252, 253, 254, 245, 246, 247, and 248, and a metal line 222.

The sixth gate line 161 may extend in the second direction D2 and may overlap the first active region ACT1 through the fourth active region ACT4. The configuration in which the sixth gate line 161 constitutes the seventh PMOS transistor MP7 and the fifth NMOS transistor MN5 is substantially the same as the embodiment described above with reference to FIG. 4B. In addition, the sixth gate line 161 overlaps the third active region ACT3 to form the fifteenth NMOS transistor MN15, and overlaps the fourth active region ACT4 to form the seventeenth PMOS transistor MP17. The first clock signal CK is applied to the sixth gate line 161 by the metal 151.

A seventh gate line 162, an eighth gate line 163, and a fifteenth gate line 262 may be disposed on both sides of the sixth gate line 161.

The eighth gate line 163 may be spaced apart from the sixth gate line 161 in the first direction D1 and extend in the second direction D2. The eighth gate line 163 may overlap the second active region ACT2 to form the seventh NMOS transistor MN7, and may overlap the third active region ACT3 to form the seventeenth NMOS transistor MN17.

The fifteenth gate line 262 may overlap the fourth active region ACT4 to form the fifteenth PMOS transistor MP15. The fifteenth gate line 262 may be aligned with the seventh gate line 162 in the second direction D2.

A sixteenth gate line 264 may be disposed to be spaced apart from the fifteenth gate line 262 in the first direction D1. The sixteenth gate line 264 may overlap the third active region ACT3 to form the sixteenth NMOS transistor MN16, and may overlap the fourth active region ACT4 to form the sixteenth PMOS transistor MP16. The sixteenth gate line 264 may be disposed to be aligned with the ninth gate line 164 in the second direction D2. The ground voltage VSS may be provided to the sixteenth NMOS transistor MN16 through the metal 245, and the power supply voltage VDD may be provided to the sixteenth PMOS transistor MP16 through the metal 247.

The first master latch 100 and the first slave latch 200 may be disposed in order in the first direction D1. In other words, the master latch 100 and the slave latch 200 share the first power rail 101 and the second power rail 102, and may be disposed to be adjacent to each other in the first direction D1. In an exemplary embodiment of the inventive concept, additional constituent elements may be additionally disposed between the master latch 100 and the slave latch 200.

The second master latch 1100 and the second slave latch 1200 may be disposed in order in the first direction D1. In other words, the second master latch 1100 and the second slave latch 1200 share the second power rail 102 and the third power rail 103, and may be disposed to be adjacent to each other in the first direction D1. In an exemplary embodiment of the inventive concept, additional constituent elements may be additionally disposed between the second master latch 1100 and the second slave latch 1200.

Figure 9A:
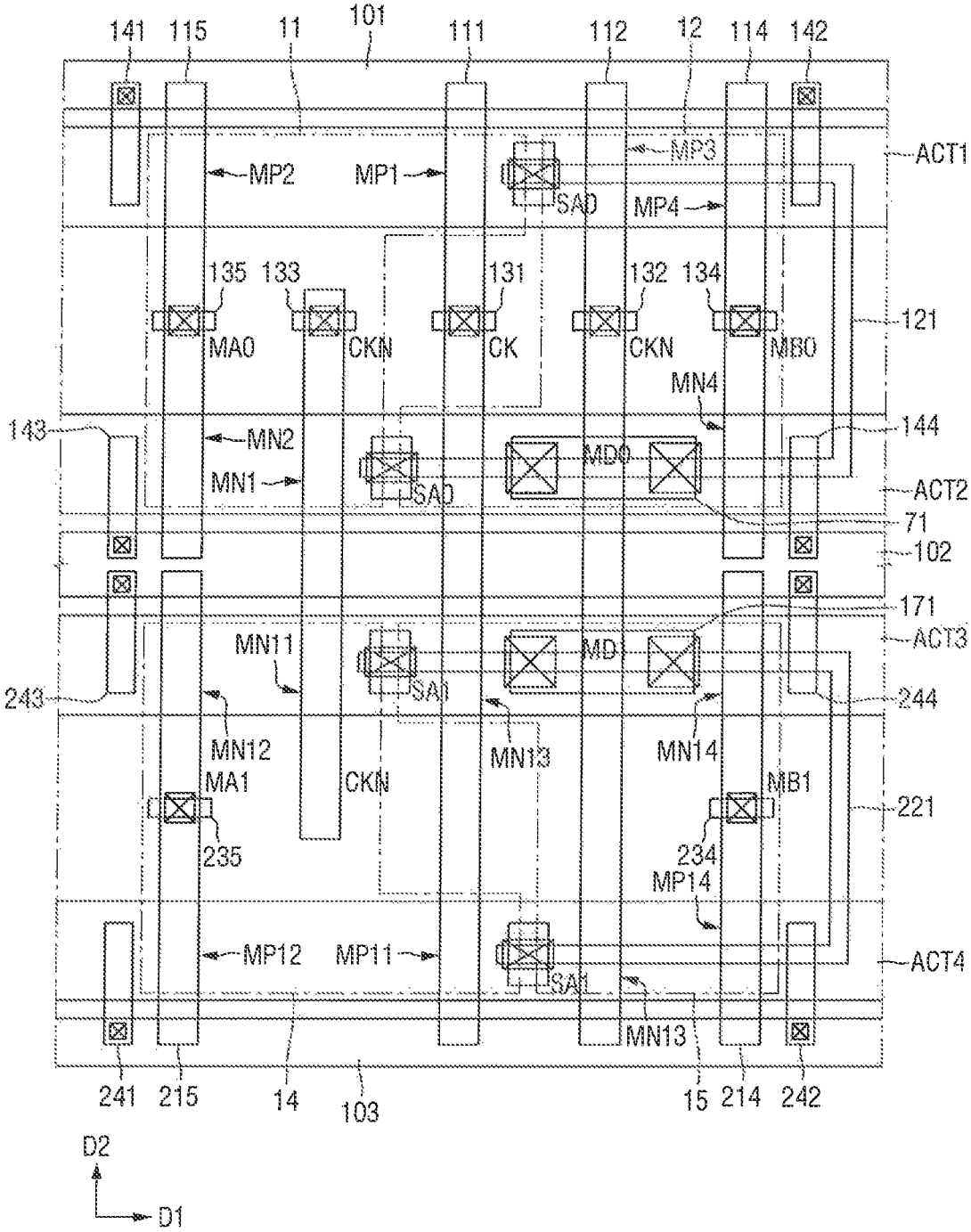
FIG. 9A is a layout diagram of the first master latch and the second master latch included in the master-slave flip flop of FIG. 6 according to an exemplary embodiment of the inventive concept.
Figure 9B:
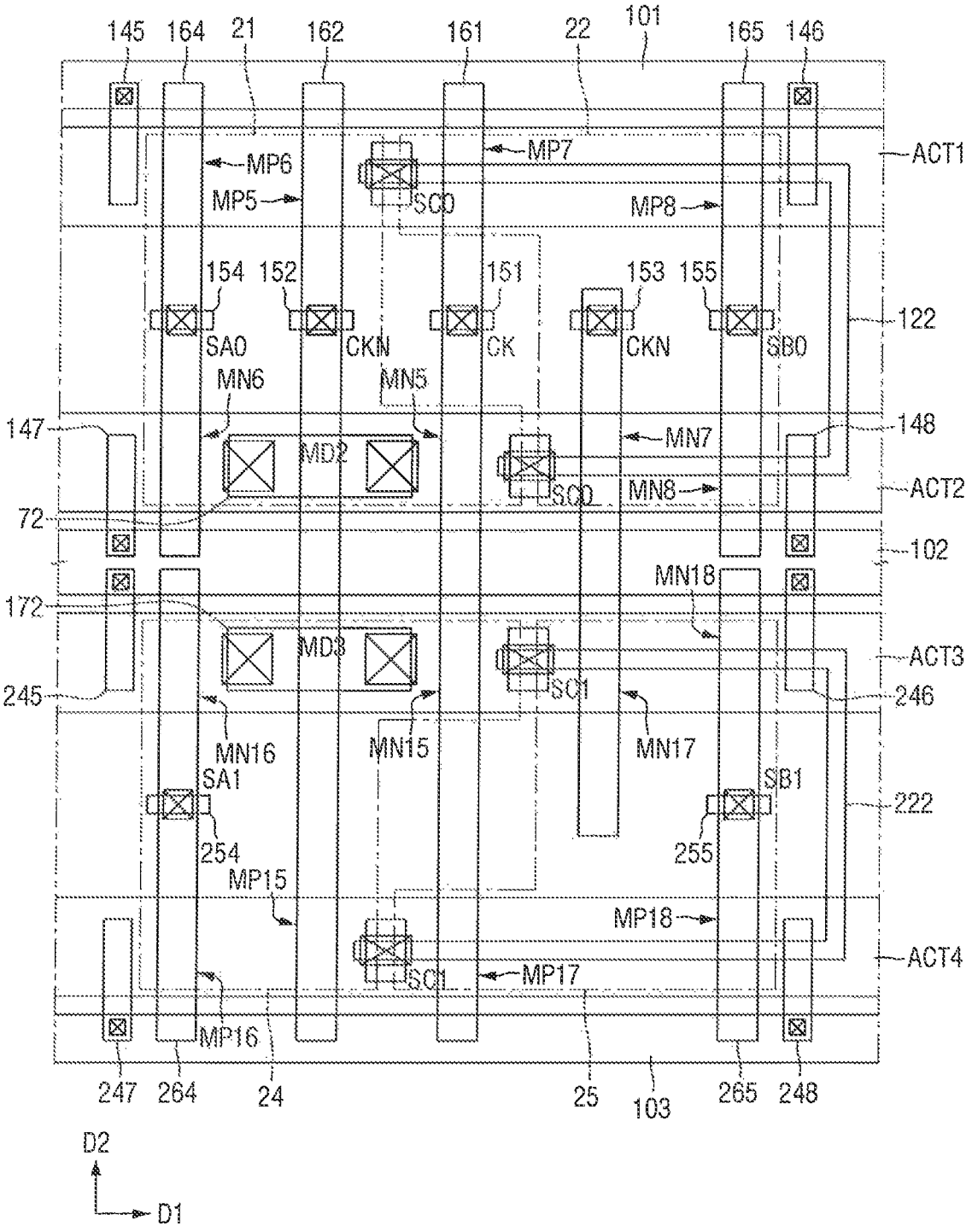
FIG. 9B is a layout diagram of the first slave latch and the second slave latch included in the master-slave flip flop of FIG. 6 according to an exemplary embodiment of the inventive concept.

FIG. 9A is a layout diagram of the first master latch and the second master latch included in the master-slave flip flop of FIG. 6 according to an exemplary embodiment of the inventive concept. FIG. 9B is a layout diagram of the first slave latch and the second slave latch included in the master-slave flip flop of FIG. 6 according to an exemplary embodiment of the inventive concept.

In the master-slave flip flop according to the exemplary embodiment illustrated in FIG. 9A, the form of the second gate line 112 may be different from that of FIG. 8A. The second gate line 112 may extend in the second direction D2 to overlap all of the first through fourth active regions ACT1 through ACT4.

At this time, the second gate line 112 may overlap the second active region ACT2 to form a new transistor. Therefore, the node MD0 shared by the third NMOS transistor MN3 and the fourth NMOS transistor MN4 may be divided by the second gate line 112. However, since it is not desirable that the potentials of the node MD0 divided by the second gate line 112 differ from each other, the second active region ACT2 on both sides of the second gate line 112 may be short-circuited through a metal 71.

The second gate line 112 may overlap the third active region ACT3 to form a new transistor. Therefore, the node MD1 shared by the thirteenth NMOS transistor MN13 and the fourteenth NMOS transistor MN14 may be divided by the second gate line 112. However, since it is not desirable that the potentials of the nodes MD1 divided by the second gate line 112 differ from each other, the third active region ACT3 on both sides of the second gate line 112 may be short-circuited through a metal 171.

Referring to FIG. 9b, the seventh gate line 162 may extend in the second direction D2 so as to overlap all the first through fourth active regions ACT1 through ACT4.

At this time, the seventh gate line 162 may overlap the second active region ACT2 to form a new transistor. Therefore, the node MD2 shared by the fifth NMOS transistor MN5 and the sixth NMOS transistor MN6 may be divided by the second gate line 112. However, since it is not desirable that the potentials of the nodes MD2 divided by the seventh gate line 162 differ from each other, the second active region ACT2 on both sides of the seventh gate line 162 may be short-circuited through a metal 72.

The seventh gate line 162 may overlap the third active region ACT3 to form a new transistor. Therefore, a node MD3 shared by the fifteenth NMOS transistor MN15 and the sixteenth NMOS transistor MN16 may be divided by the seventh gate line 162. However, since it is not desirable that the potentials of the nodes MD3 divided by the seventh gate line 162 differ from each other, the third active region ACT3 on both sides of the seventh gate line 162 may be short-circuited through a metal 172.

Figure 10A:
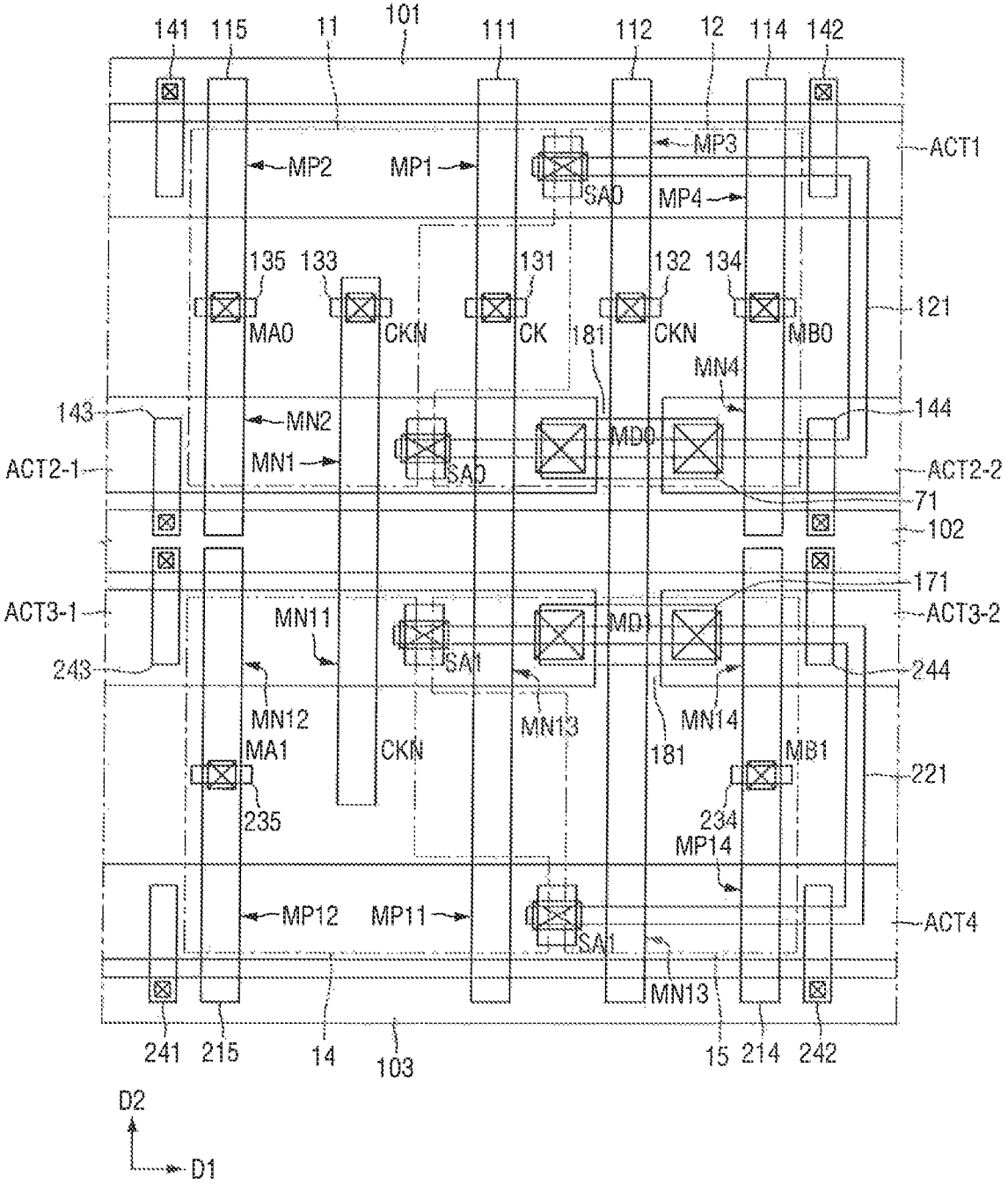
FIG. 10A is a layout diagram of the first master latch and the second master latch included in the master-slave flip flop of FIG. 6 according to an exemplary embodiment of the inventive concept.
Figure 10B:
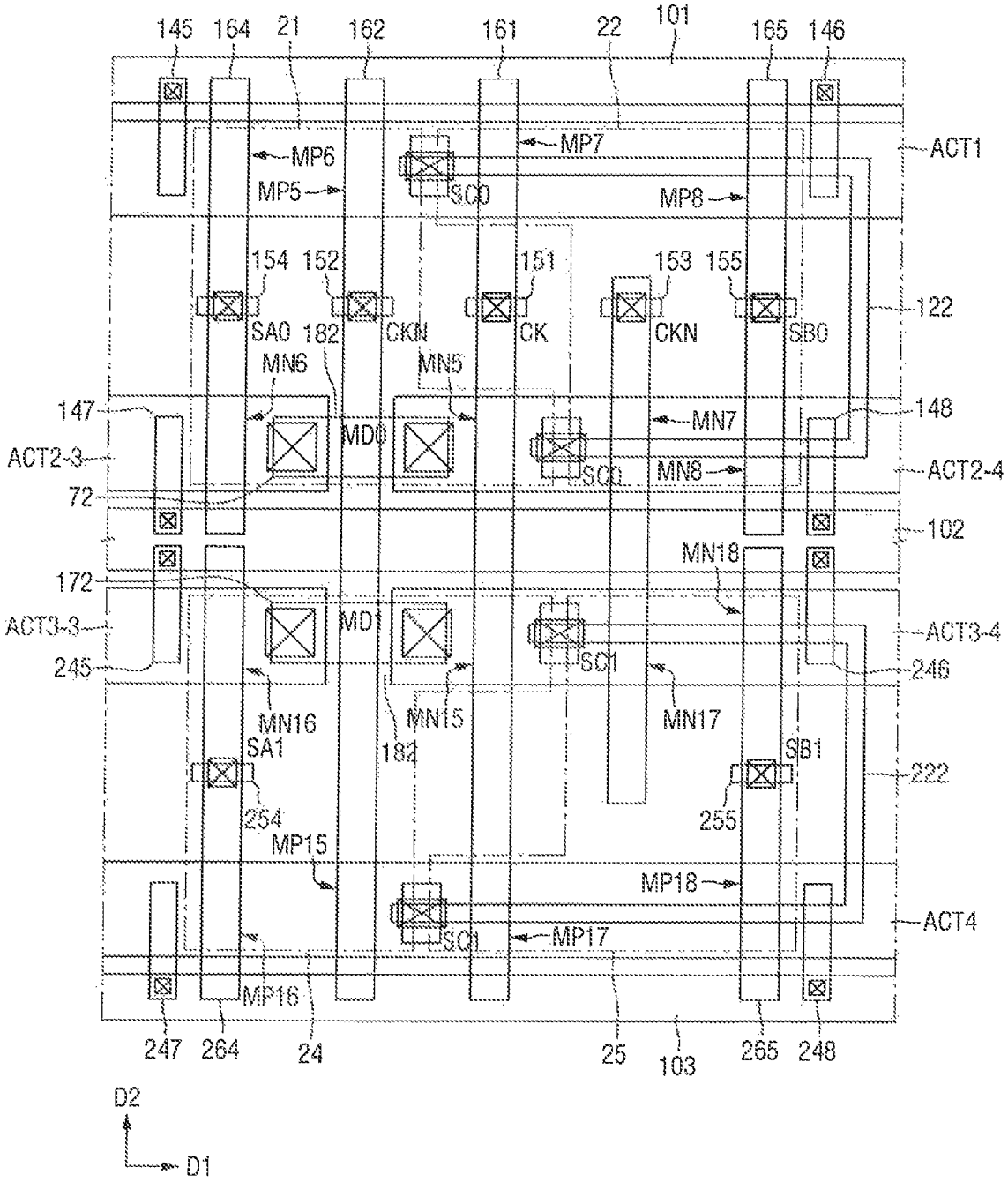
FIG. 10B is a layout diagram of the first slave latch and the second slave latch included in the master-slave flip flop of FIG. 6 according to an exemplary embodiment of the inventive concept.

FIG. 10A is a layout diagram of the first master latch and the second master latch included in the master-slave flip flop of FIG. 6 according to an exemplary embodiment of the inventive concept. FIG. 10B is a layout diagram of the first slave latch and the second slave latch included in the master-slave flip flop of FIG. 6 according to an exemplary embodiment of the inventive concept.

Referring to FIG. 10A, the second gate line 112 may not overlap the second active region ACT2 and the third active regions ACT3. In other words, the second active region ACT2 may be divided into a first sub-active region ACT2-1 and a second sub-active region ACT2-2 by an element isolation film 181. Therefore, unlike the aforementioned embodiment of FIG. 9A, the second gate line 112 does not overlap the second active region ACT2, and there may also be no transistor formed by the overlap.

The third active region ACT3 may also be divided into a third sub-active region ACT3-1 and a fourth sub-active region ACT3-2 by the element isolation film 181. Therefore, the second gate line 112 does not overlap the third active region ACT3, and there may also be no transistor formed by the overlap.

Referring to FIG. 10B, the seventh gate line 162 may not overlap the second active region ACT2 and the third active region ACT3. In other words, the second active region ACT2 may be divided into a fifth sub-active region ACT2-3 and a sixth sub-active region ACT2-4 by an element isolation film 182. Therefore, unlike the aforementioned embodiment of FIG. 9B, the seventh gate line 162 does not overlap the second active region ACT2, and there may also be no transistor formed by the overlap.

The third active region ACT3 may also be divided into a seventh sub-active region ACT3-3 and an eighth sub-active region ACT3-4 by the element isolation film 182. Therefore, the seventh gate line 162 does not overlap the third active region ACT3, and there may also be no transistor formed by the overlap.

While the inventive concept has been shown and described with reference to exemplary embodiments thereof, it will be apparent to those of ordinary skill in the art that various modifications in form and details may be made thereto without departing from the spirit and scope of the inventive concept, as set forth by the following claims.

What is claimed is:

1. A master-slave flip flop comprising a master latch and a slave latch which are sequentially disposed on a substrate in a first direction, wherein the master latch includes a first NMOS transistor and a first PMOS transistor each gated by a first clock signal, and the first NMOS transistor and the first PMOS transistor share a first gate line extending in a second direction [intersecting with] *different from* the first direction, and the slave latch includes a second NMOS transistor and a second PMOS transistor each gated by the first clock signal, and the second NMOS transistor and the second PMOS transistor share a second gate line extending in the second direction.

2. The master-slave flip flop of claim 1, wherein the master latch further comprises:

a third PMOS transistor which is gated by a second clock signal obtained by inverting the first clock signal and shares a drain region with the first PMOS transistor; and a third NMOS transistor which is gated by the second clock signal and shares a drain region with the first NMOS transistor, and the slave latch further comprises:

a fourth PMOS transistor which is gated by the second clock signal and shares a drain region with the second PMOS transistor; and a fourth NMOS transistor which is gated by the second clock signal and shares a drain region with the second NMOS transistor.

3. The master-slave flip flop of claim 2, wherein the third PMOS transistor includes a third gate line extending in the second direction, and the third NMOS transistor includes a fourth gate line extending in the second direction.

4. The master-slave flip flop of claim 3, wherein the third gate line is disposed on one side of the first gate line, and the fourth gate line is disposed on the other side of the first gate line.

5. The master-slave flip flop of claim 4, wherein the substrate has a first active region in which the first PMOS transistor is formed, and a second active region in which the first NMOS transistor is formed, and the third gate line does not overlap the second active region, and the fourth gate line does not overlap the first active region.

6. The master-slave flip flop of claim 2, wherein the fourth PMOS transistor includes a third gate line extending in the second direction, and the fourth NMOS transistor includes a fourth gate line extending in the second direction.

7. The master-slave flip flop of claim 6, wherein the third gate line and the fourth gate line are not aligned in the second direction.

8. The master-slave flip flop of claim 2, further comprising:

an inverter, wherein the first clock signal is directly input from a clock signal terminal without passing through the inverter, and the inverter inverts the first clock signal to output the second dock signal.

9. The master-slave flip flop of claim 1, further comprising:

a first fin and a second fin formed to protrude from the substrate and extending in the first direction, wherein the first PMOS transistor is a fin-type transistor formed by intersection of the first gate line and the first fin, and the first NMOS transistor is a fin-type transistor formed by intersection of the first gate line and the second fin.

10. A master-slave flip flop comprising a first master slave circuit and a second master slave circuit which share a first clock signal, wherein the first master slave circuit includes a first master latch and a first slave latch disposed on a substrate sequentially in a first direction, the second master slave circuit includes a second master latch and a second slave latch disposed on the substrate sequentially in the first direction, the first master latch includes a first NMOS transistor and a first PMOS transistor each gated by the first clock signal, and the first NMOS transistor and the first PMOS transistor share a first gate line extending in a second direction intersecting with the first direction, the second master latch includes a second PMOS transistor and a second NMOS transistor which share the first gate line and are each gated by the first clock signal, the first slave latch includes a third NMOS transistor and a third PMOS transistor each gated by the first clock signal, and the third NMOS transistor and the third PMOS transistor share a second gate line extending in the second direction, and the second slave latch includes a fourth PMOS transistor and a fourth NMOS transistor which share the second gate line and are each gated by the first clock signal.

11. The master-slave flip flop of claim 10, wherein the first master latch and the second master latch are disposed side by side in the [first] *second* direction.

12. The master-slave flip flop of claim 10, Wherein the first slave latch includes a fifth NMOS transistor including a third gate line extending in the second direction on one side of the second gate line, and the second slave latch includes a sixth NMOS transistor sharing the third gate line, and the fifth NMOS transistor and the sixth NMOS transistor are aligned in the second direction.

13. The master-slave flip flop of claim 10, wherein the first master latch includes a fifth NMOS transistor including a third gate line extending in the second direction on one side of the first gate line, and the second master latch includes a sixth NMOS transistor sharing the third gate line, and the fifth NMOS transistor and the sixth NMOS transistor are aligned in the second direction.

14. The master-slave flip flop of claim 13, wherein the first master latch further includes a fifth PMOS transistor including a fourth gate line extending in the second direction on the other side of the first gate line, the second master latch further includes a sixth PMOS transistor including a fifth gate line extending in the second direction on the other side of the first gate line, and the fourth gate line and the fifth gate line are aligned in the second direction.

[15. The master-slave flip flop of claim 14, wherein the fourth gate line and the fifth gate line are connected to each other, and the fifth PMOS transistor and the sixth PMOS transistor share the fourth gate line and the fifth gate line connected to each other.]

16. The master-slave flip flop of claim 10, further comprising:

an inverter, wherein the first clock signal is directly input from a clock signal terminal without passing through the inverter, and the inverter inverts the first clock signal to output a second clock signal.

17. A master-slave flip flop comprising a master latch and a slave latch which are disposed side by side in a [second] *first* direction [intersecting with] *different from* a [first] *second* direction and share a first power rail and a second power rail, on a substrate including a first active region and a second active region each extending in the first direction and spaced apart from each other in the second direction, wherein the master latch includes:

a first gate line extending in the second direction;

a first transistor formed by overlap of the first gate line and the first active region; and a second transistor formed by overlap of the first gate line and the second active region, and the slave latch includes:

a second gate line extending in the second direction;

a third transistor formed by overlap of the second gate line and the first active region; and a fourth transistor formed by overlap of the second gate line and the second active region.

18. The master-slave flip flop of claim 17, wherein the master latch further comprises:

a third gate line which extends in the second direction on one side of the first gate line and overlaps the first active region to form a fifth transistor; and a fourth gate line which extends in the second direction on the other side of the first gate line and overlaps the second active region to form a sixth transistor.

19. The master-slave flip flop of claim 18, wherein the third gate line does not overlap the second active region, and the fourth gate line does not overlap the first active region.

20. The master-slave flip flop of claim 17, wherein the slave latch comprises:

a third gate line which extends in the second direction on one side of the second gate line and overlaps the first active region to form a fifth transistor; and a fourth gate line which extends in the second direction on the other side of the first gate line and overlaps the second active region to form a sixth transistor.

*21. The master-slave flip flop of claim 3, wherein a length of the first gate line is greater than a length of the third gate line in the second direction and is greater than a length of the fourth gate line in the second direction.*

*22. The master-slave flip flop of claim 2, wherein the third PMOS transistor includes a third gate line extending in the second direction.*

*23. The master-slave flip flop of claim 2, wherein the third NMOS transistor includes a third gate line extending in the second direction.*

*24. The master-slave fliip flop of claim 3, wherein a length of the second gate line is greater than a length of the third gate line in the second direction and is greater than a length of the fourth gate line in the second direction.*

*25. The master-slave flip flop of claim 2, wherein the fourth PMOS transistor includes a third gate line extending in the second direction.*

*26. The master-slave flip flop of claim 2, wherein the fourth NMOS transistor includes a third gate line extending in the second direction.*

*27. A master-slave flip flop comprising a master latch and a slave latch which are sequentially disposed on a substrate in a first direction,*

*wherein the master latch includes a plurality of first transistors, and at least two of the first transistors are gated by a first clock signal and share a first gate line,*

*wherein an entire length of the first gate line extends in a straight line in a second direction, and the second direction is different from the first direction,*

*wherein the slave latch includes a plurality of second transistors, and at least two of the second transistors are gated by the first clock signal and share a second gate line,*

*wherein an entire length of the second gate line extends in a straight line in the second direction.*

*28. The master-slave flip flop of claim 27,*

*wherein the plurality of first transistors comprises:*

*a first NMOS transistor;*

*a first PMOS transistor,*

*wherein the first NMOS transistor and the first PMOS transistor share the first gate line;*

*a third PMOS transistor which is gated by a second clock signal obtained by inverting the first clock signal and shares a drain region with the first PMOS transistor; and*

*a third NMOS transistor which is gated by the second clock signal and shares a drain region with the first NMOS transistor, and*

*the plurality of second transistors comprises:*

*a second NMOS transistor;*

*a second PMOS transistor;*

*wherein the second NMOS transistor and the second PMOS transistor share the second gate line;*

*a fourth PMOS transistor which is gated by the second clock signal and shares a drain region with the second PMOS transistor; and*

*a fourth NMOS transistor which is gated by the second clock signal and shares a drain region with the second NMOS transistor.*

*29. The master-slave fliip flop of claim 28, wherein the third PMOS transistor includes a third gate line extending in the second direction; and*

*the third NMOS transistor includes a fourth gate line extending in the second direction.*

*30. The master-slave flip flop of claim 29, wherein the third gate line is disposed on one side of the first gate line, and the fourth gate line is disposed on the other side of the first gate line.*

*31. The master-slave flip flop of claim 30, wherein the substrate has a first active region in which the first PMOS transistor is formed, and a second active region in which the first NMOS transistor is formed, and*

*the third gate line does not overlap the second active region, and the fourth gate line does not overlap the first active region.*

*32. The master-slave flip flop of claim 28, wherein the fourth PMOS transistor includes a third gate line extending in the second direction, and*

*the fourth NMOS transistor includes a fourth gate line extending in the second direction.*

*33. The master-slave flip flop of claim 32, wherein the third gate line and the fourth gate line are not aligned in the second direction.*

*34. The master-slave flip flop of claim 28, further comprising:*

*an inverter,*

*wherein the first clock signal is directly input from a clock signal terminal without passing through the inverter, and*

*the inverter inverts the first clock signal to output the second clock signal.*

*35. The master-slave flip flop of claim 27, further comprising:*

*a first fin and a second fin formed to protrude from the substrate and extending in the first direction,*

*wherein the plurality of first transistors comprises a first NMOS transistor and a first PMOS transistor, and the first NMOS transistor and the first PMOS transistor share the first gate line,*

*wherein the first PMOS transistor is a fin-type transistor formed by intersection of the first gate line and the first fin, and*

*the first NMOS transistor is a fin-type transistor formed by intersection of the first gate line and the second fin.*

*36. A master-slave flip flop comprising a master latch and a slave latch which are sequentially disposed on a substrate in a first direction,*

*wherein the master latch includes a plurality of first transistors, and at least two of the first transistors are gated by a first clock signal and share a first gate line,*

*wherein an entire length of the first gate line extends in a straight line in a second direction, and the second direction is different from the first direction,*

*wherein the slave latch includes a plurality of second transistors, and at least two of the second transistors are gated by the first clock signal and share a second gate line.*

*37. The master-slave flip flop of claim 36,*

*wherein the plurality of first transistors comprises:*

*a first NMOS transistor;*

*a first PMOS transistor,*

*wherein the first NMOS transistor and the first PMOS transistor share the first gate line;*

*a third PMOS transistor which is gated by a second clock signal obtained by inverting the first clock signal and shares a drain region with the first PMOS transistor; and*

*a third NMOS transistor which is gated by the second clock signal and shares a drain region with the first NMOS transistor, and*

*the plurality of second transistors comprises:*

*a second NMOS transistor;*

*a second PMOS transistor,*

*wherein the second NMOS transistor and the second PMOS transistor share the second gate line;*

*a fourth PMOS transistor which is gated by the second clock signal and shares a drain region with the second PMOS transistor; and*

*a fourth NMOS transistor which is gated by the second clock signal and shares a drain region with the second NMOS transistor.*

*38. The master-slave flip flop of claim 37, wherein the third PMOS transistor includes a third gate line extending in the second direction; and*

*the third NMOS transistor includes a fourth gate line extending in the second direction.*

*39. The master-slave flip flop of claim 38, wherein the third gate line is disposed on one side of the first gate line; and the fourth gate line is disposed on the other side of the first gate line.*

*40. The master-slave flip flop of claim 39, wherein the substrate has a first active region in which the first PMOS transistor is formed, and a second active region in which the first NMOS transistor is formed, and*

*the third gate line does not overlap the second active region, and the fourth gate line does not overlap the first active region.*

*41. The master-slave flip flop of claim 37, wherein the fourth PMOS transistor includes a third gate line extending in the second direction, and*

*the fourth NMOS transistor includes a fourth gate line extending in the second direction.*

*42. The master-slave flip flop of claim 41, wherein the third gate line and the fourth gate line are not aligned in the second direction.*

*43. The master-slave flip flop of claim 37, further comprising:*

*an inverter*

*wherein the first clock signal is directly input from a clock signal terminal without passing through the inverter, and*

*the inverter inverts the first clock signal to output the second clock signal.*

*44. The master-slave flip flop of claim 36, further comprising:*

*a first fin and a second fin formed to protrude from the substrate and extending in the first direction,*

*wherein the plurality of first transistors comprises a first NMOS transistor and a first PMOS transistor, and the first NMOS transistor and the first PMOS transistor share the first gate line,*

*wherein the first PMOS transistor is a fin-tvpe transistor formed by intersection of the first gate line and the first fin, and*

*the first NMOS transistor is a fin-type transistor formed by intersection of the first gate line and the second fin.*

*45. A master-slave flip flop comprising a master latch and a slave latch which are sequentiallv disposed on a substrate in a first direction,*

*wherein the master latch includes a plurality of first transistors, and at least two of the first transistors are gated by a first clock signal and share a first gate line,*

*wherein the slave latch includes a plurality of second transistors, and at least two of the second transistors are gated by the first clock signal and share a second gate line,*

*wherein an entire length of the second gate line extends in a straight line in the second direction, and the second direction is different from the first direction.*

*46. The master-slave flip flop of claim 45, wherein the plurality of first transistors comprises:*

*a first NMOS transistor;*

*a first PMOS transistor,*

*wherein the first NMOS transistor and the first PMOS transistor share the first gate line;*

*a third PMOS transistor which is gated by a second clock signal obtained by inverting the first clock signal and shares a drain region with the first PMOS transistor; and*

*a third NMOS transistor which is gated by the second clock signal and shares a drain region with the first NMOS transistor, and*

*the plurality of second transistors comprises:*

*a second NMOS transistor;*

*a second PMOS transistor,*

*wherein the second NMOS transistor and the second PMOS transistor share the second gate line,*

*a fourth PMOS transistor which is gated by the second clock signal and shares a drain region with the second PMOS transistor; and*

*a fourth NMOS transistor which is gated by the second clock signal and shares a drain region with the second NMOS transistor.*

*47. The master-slave flip flop of claim 46, wherein the third PMOS transistor includes a third gate line extending in the second direction, and*

*the third NMOS transistor includes a fourth gate line extending in the second direction.*

*48. The master-slave flip flop of claim 47, wherein the third gate line is disposed on one side of the first gate line, and the fourth gate line is disposed on the other side of the first gate line.*

*49. The master-slave flip flop of claim 48, wherein the substrate has a first active region in which the first PMOS transistor is formed, and a second active region in which the first NMOS transistor is formed, and*

*the third gate line does not overlap the second active region, and the fourth gate line does not overlap the first active region.*

*50. The master-slave flip flop of claim 46, wherein the fourth PMOS transistor includes a third gate line extending in the second direction, and*

*the fourth NMOS transistor includes a fourth gate line extending in the second direction.*

*51. The master-slave flip flop of claim 50, wherein the third gate line and the fourth gate line are not aligned in the second direction.*

*52. The master-slave flip flop of claim 46, further comprising:*

*an inverter*

*wherein the first clock signal is directly input from a clock signal terminal without passing through the inverter, and*

*the inverter inverts the first clock signal to output the second clock signal.*

*53. The master-slave flip flop of claim 45, further comprising:*

*a first fin and a second fin formed to protrude from the substrate and extending in the first direction,*

*wherein the plurality of first transistors comprises a first NMOS transistor and a first PMOS transistor, and the first NMOS transistor and the first PMOS transistor share the first gate line,*

*wherein the first PMOS transistor is a fin-type transistor formed by intersection of the first gate line and the first fin, and*

*the first NMOS transistor is a fin-type transistor formed by intersection of the first gate line and the second fin.*

*54. A master-slave flip flop comprising a master circuit and a slave circuit which are sequentiallv disposed on a substrate in a first direction, the master-slave flip flop comprising:*

*the master circuit comprising a plurality of first transistors, wherein at least two of the first transistors are gated by a first clock signal and share a first gate line straightly extending in a second direction intersecting the first direction;*

*the slave circuit comprising a plurality of second transistors, wherein at least two of the second transistors are gated by the first clock signal and share a second gate line straightly extending in the second direction; and*

*an inverter*

*wherein the first clock signal is directly provided from a clock signal terminal without passing through the inverter and gates the at least two of the first transistors and the at least two of the second transistors, and*

*a second clock signal is an inversion of the first clock signal provided by the inverter, and the second clock signal gates other transistors of the first transistors and other transistors of the second transistors.*

*55. A master-slave flip flop comprising a master latch and a slave latch which are sequentially disposed on a substrate in a first direction,*

*wherein the master latch includes a first NMOS transistor and a first PMOS transistor each gated by a first clock signal, and the first NMOS transistor and the first PMOS transistor share a first gate line extending in a second direction different from the first direction,*

*the slave latch includes a second NMOS transistor and a second PMOS transistor each gated by the first clock signal, and the second NMOS transistor and the second PMOS transistor share a second gate line extending in the second direction, and*

*the first clock signal is directly applied to the master latch from a clock signal terminal.*

*56. An integrated circuit comprising a master latch and a slave latch which are sequentially disposed on a substrate in a first direction, the integrated circuit comprising:*

*a scan circuit connected to the master latch,*

*wherein the master latch operates under control of the scan circuit;*

*the master latch,*

*wherein the master latch comprises a plurality of first transistors, and at least two of the first transistors are gated by a first clock signal and share a first gate line straightly extending in a second direction different from the first direction; and*

*the slave latch,*

*wherein the slave latch comprises a plurality of second transistors,*

*wherein at least two of the second transistors are gated by the first clock signal and share a second gate line straightly extending in the second direction.*

*57. The integrated circuit of claim 56, wherein the scan circuit comprises:*

*a first scan tri-state inverter that receives a scan input signal;*

*an inverter that receives a scan enable signal; and*

*a second scan tri-state inverter that receives a data signal,*

*wherein the scan circuit outputs the scan input signal to the master latch through the first scan tri-state inverter, and outputs the data signal to the master latch through the second scan tri-state inverter, based on the scan enable signal.*

*58. A master-slave flip flop comprising a master latch and a slave latch which are sequentiallv disposed on a substrate in a first direction,*

*wherein the master latch includes a plurality of first transistors, and the slave latch includes a plurality of second transistors,*

*wherein a first first transistor of the plurality of first transistors is connected to a first gate line extending in a second direction different from the first direction, a second first transistor of the plurality of first transistors is connected to a second gate line extending in the second direction, and a third first transistor of the plurality of first transistors is connected to a third gate line extending in the second direction,*

*wherein the first first transistor is gated by a first clock signal, and each of the second first transistor and the third first transistor is gated by a second clock signal obtained by inverting the first clock signal,*

*wherein each transistor among the plurality of second transistors is gated by the first clock signal or the second clock signal,*

*wherein the first gate line is disposed in a first column extending in the second direction, the second gate line is disposed in a second column extending in the second direction, and the third gate line is disposed in a third column extending in the second direction,*

*wherein the first, second and third columns are spaced apart from on another in the first direction.*

*59. The master-slave flip flop of claim 58, wherein no intervening gate lines are disposed between the first gate line and the second gate line, and no intervening gate lines are disposed between the first gate line and the third gate line.*

*60. The master-slave flip flop of claim 58, wherein a first second transistor of the plurality of second transistors is connected to a fourth gate line extending in the second direction, a second second transistor of the plurality of second transistors is connected to a fifth gate line extending in the second direction, and a third second transistor of the plurality of second transistors is connected to a sixth gate line extending in the second direction,*

*wherein the fourth gate line is disposed in a fourth column extending in the second direction, the fifth gate line is disposed in a fifth column extending in the second direction, and the sixth gate line is disposed in a sixth column extending in the second direction,*

*wherein the fourth column, the fifth column and the sixth column are spaced apart from one another in the first direction.*

*61. The master-slave flip flop of claim 60, wherein no intervening gate lines are disposed between the fourth gate*

*line and the fifth gate line, and no intervening gate lines are disposed between the fourth gate line and the sixth gate line.*

*62. The master-slave flip flop of claim 60,*

*wherein the first first transistor is an NMOS transistor, the second first transistor is an NMOS transistor, and the third first transistor is a PMOS transistor,*

*wherein the plurality of first transistors further comprises a fourth first transistor which is a PMOS transistor,*

*wherein the first first transistor and the fourth first transistor share the first gate line, and the fourth first transistor is gated by the first clock signal,*

*wherein the third first transistor is gated by the second clock signal obtained by inverting the first clock signal and shares a drain region with the fourth first transistor,*

*wherein the second first transistor shares a drain region with the first first transistor.*

*63. The master-slave flip flop of claim 62,*

*wherein the first second transistor is an NMOS transistor, the second second transistor is a PMOS transistor, and the third second transistor is an NMOS transistor,*

*wherein the plurality of second transistors further comprises a fourth second transistor which is a PMOS transistor,*

*wherein the first second transistor and the fourth second transistor are gated by the first clock signal and share the fourth gate line,*

*wherein the third second transistor is gated by the second clock signal obtained by inverting the first clock signal and shares a drain region with the first second transistor,*

*wherein the second second transistor is gated by the second clock signal and shares a drain region with the fourth second transistor.*

*64. The master-slave flip flop of claim 58, wherein the second gate line is disposed on one side of the first gate line, and the third gate line is disposed on the other side of the first gate line.*

*65. The master-slave flip flop of claim 60, wherein the fifth gate line is disposed on one side of the fourth gate line, and the sixth gate line is disposed on the other side of the fourth gate line.*

*66. A master-slave flip flop comprising a master latch and a slave latch which are sequentially disposed on a substrate in a first direction,*

*wherein the slave latch includes a plurality of first transistors, and the master latch includes a plurality of second transistors,*

*wherein a first first transistor of the plurality of first transistors is connected to a first gate line extending in a second direction different from the first direction, a second first transistor of the plurality of first transistors is connected to a second gate line extending in the second direction, and a third first transistor of the plurality of first transistors is connected to a third gate line extending in the second direction,*

*wherein the first first transistor is gated by a first clock signal, and each of the second first transistor and the third first transistor is gated by a second clock signal obtained by inverting the first clock signal,*

*wherein each transistor among the plurality of second transistors is gated by the first clock signal or the second clock signal,*

*wherein the first gate line is disposed in a first column extending in the second direction, the second gate line is disposed in a second column extending in the second direction, and the third gate line is disposed in a third column extending in the second direction,*

*wherein the first column, the second column and the third column are spaced apart from one another in the first direction.*

*67. The master-slave flip flop of claim 66, wherein no intervening gate lines are disposed between the first gate line and the second gate line, and no intervening gate lines are disposed between the first gate line and the third gate line.*

*68. A master-slave flip flop comprising a master latch and a slave latch which are disposed side by side in a first direction different from a second direction, the master-slave flip flop comprising:*

*a first power rail; and*

*a second power rail,*

*wherein the master latch and the slave latch share the first power rail and the second power rail,*

*wherein the master latch and the slave latch are disposed on a substrate including a first active region and a second active region each extending in the first direction and spaced apart from each other in the second direction,*

*wherein the master latch includes:*

*a first gate line straightly extending in the second direction;*

*a first transistor formed by overlap of the first gate line and the first active region; and*

*a second transistor formed by overlap of the first gate line and the second active region, wherein a first clock signal is provided to the first gate line, and*

*the slave latch includes:*

*a second gate line straightly extending in the second direction;*

*a third transistor formed by overlap of the second gate line and the first active region; and*

*a fourth transistor formed by overlap of the second gate line and the second active region, wherein the first clock signal is provided to the second gate line.*

*69. The master-slave flip flop of claim 68, wherein the first power rail is adjacent to the second power rail.*

*70. The master-slave flip flop of claim 68, wherein no intervening power rails are disposed between the first power rail and the second power rail.*

*71. A master-slave flip flop comprising a master latch and a slave latch which are sequentially disposed on a substrate in a first direction, the master-slave flip flop comprising:*

*a first power rail extending in the first direction that transmits a first voltage; and*

*a second power rail extending in the first direction that transmits a second voltage,*

*wherein the master latch includes a plurality of first transistors connected between the first power rail and the second power rail, and at least two of the first transistors are gated by a first clock signal and share a first gate line,*

*wherein an entire length of the first gate line extends in a straight line in a second direction, and the second direction is different from the first direction,*

*wherein the slave latch includes a plurality of second transistors connected between the first power rail and the second power rail; and at least two of the second transistors are gated by the first clock signal and share a second gate line,*

*wherein the master latch and the slave latch share the first power rail and the second power rail.*

*72. The master-slave flip flop of claim 71,*

*wherein the plurality of first transistors comprises:*

*a first NMOS transistor;*

*a first PMOS transistor,*

*wherein the first NMOS transistor and the first PMOS transistor share the first gate line;*

*a third PMOS transistor which is gated by a second clock signal obtained by inverting the first clock signal and shares a drain region with the first PMOS transistor; and*

*a third NMOS transistor which is gated by the second clock signal and shares a drain region with the first NMOS transistor, and*

*the plurality of second transistors comprises:*

*a second NMOS transistor;*

*a second PMOS transistor;*

*wherein the second NMOS transistor and the second PMOS transistor share the second gate line;*

*a fourth PMOS transistor which is gated by the second clock signal and shares a drain region with the second PMOS transistor; and*

*a fourth NMOS transistor which is gated by the second clock signal and shares a drain region with the second NMOS transistor.*

*73. A master-slave flip flop comprising a master latch and a slave latch which are sequentially disposed on a substrate in a first direction, the master-slave flip flop comprising:*

*a first power rail extending in the first direction that transmits a first voltage; and*

*a second power rail extending in the first direction that transmits a second voltage,*

*wherein the master latch includes a plurality of first transistors connected between the first power rail and the second power rail, and at least two of the first transistors are gated by a first clock signal and share a first gate line,*

*wherein the slave latch includes a plurality of second transistors connected between the first power rail and the second power rail, and at least two of the second transistors are gated by the first clock signal and share a second gate line,*

*wherein an entire length of the second gate line extends in a straight line in a second direction, and the second direction is different from the first direction,*

*wherein the master latch and the slave latch share the first power rail and the second power rail.*

*74. The master-slave flip flop of claim 73,*

*wherein the plurality of first transistors comprises:*

*a first NMOS transistor;*

*a first PMOS transistor,*

*wherein the first NMOS transistor and the first PMOS transistor share the first gate line;*

*a third PMOS transistor which is gated by a second clock signal obtained by inverting the first clock signal and shares a drain region with the first PMOS transistor; and*

*a third NMOS transistor which is gated by the second clock signal and shares a drain region with the first NMOS transistor, and*

*the plurality of second transistors comprises:*

*a second NMOS transistor;*

*a second PMOS transistor;*

*wherein the second NMOS transistor and the second PMOS transistor share the second gate line;*

*a fourth PMOS transistor which is gated by the second clock signal and shares a drain region with the second PMOS transistor; and*

*a fourth NMOS transistor which is gated by the second clock signal and shares a drain region with the second NMOS transistor.*

*75. A master-slave flip flop comprising a master latch and a slave latch which are sequentially disposed on a substrate in a first direction, the master-slave flip flop comprising:*

*a first power rail extending in the first direction that transmits a first voltage; and*

*a second power rail extending in the first direction that transmits a second voltage,*

*wherein the master latch includes a first NMOS transistor and a first PMOS transistor each gated by a first clock signal and connected between the first power rail and the second power rail, and the first NMOS transistor and the first PMOS transistor share a first gate line extending in a second direction different from the first direction,*

*the slave latch includes a second NMOS transistor and a second PMOS transistor each gated by the first clock signal and connected between the first power rail and the second power rail, and the second NMOS transistor and the second PMOS transistor share a second gate line extending in the second direction,*

*the first clock signal is directly applied to the master latch from a clock signal terminal, and*

*the master latch and the slave latch share the first power rail and the second power rail.*

*76. A master-slave flip flop comprising a master latch and a slave latch which are disposed side by side in a first direction different from a second direction, the master-slave flip flop comprising:*

*a first power rail;*

*a second power rail,*

*wherein the master latch and the slave latch share the first power rail and the second power rail,*

*wherein the master latch and the slave latch are disposed on a substrate including a first active region and a second active region each extending in the first direction and spaced apart from each other in the second direction,*

*wherein the master latch comprises:*

*a first gate line extending in the second direction;*

*wherein an entire length of the first gate line extends in a straight line in the second direction;*

*a first transistor formed by overlap of the first gate line and the first active region; and*

*a second transistor formed by overlap of the first gate line and the second active region; and*

*wherein the slave latch comprises:*

*a second gate line extending in the second direction;*

*wherein an entire length of the second gate line extends in a straight line in the second direction;*

*a third transistor formed by overlap of the second gate line and the first active region; and*

*a fourth transistor formed by overlap of the second gate line and the second active region.*

*77. The master-slave flip flop of claim 76, wherein the master latch further comprises:*

*a third gate line which extends in the second direction on one side of the first gate line and overlaps the first active region to form a fifth transistor; and*

*a fourth gate line which extends in the second direction on the other side of the first gate line and overlaps the second active region to form a sixth transistor.*

*78. The master-slave flip flop of claim 77, wherein the third gate line does not overlap the second active region, and the fourth gate line does not overlap the first active region.*

*79. The master-slave flip flop of claim 76, wherein the slave latch further comprises:*

*a third gate line which extends in the second direction on one side of the second gate line and overlaps the first active region to form a fifth transistor; and*

*a fourth gate line which extends in the second direction on the other side of the first gate line and overlaps the second active region to form a sixth transistor.*

* * * * *